United States Patent
Erlich

(10) Patent No.: US 10,742,233 B2
(45) Date of Patent: Aug. 11, 2020

(54) EFFICIENT ENCODING OF DATA FOR STORAGE IN POLYMERS SUCH AS DNA

(71) Applicant: Erlich Lab LLC, Ra'ananna (IL)

(72) Inventor: Yaniv Erlich, Las Vegas, NV (US)

(73) Assignee: Erlich Lab LLC, Ra'ananna (IL)

( * ) Notice: Subject to any disclaimer, the term of this patent is extended or adjusted under 35 U.S.C. 154(b) by 0 days.

(21) Appl. No.: 16/032,946

(22) Filed: Jul. 11, 2018

(65) Prior Publication Data

US 2019/0020353 A1    Jan. 17, 2019

Related U.S. Application Data

(60) Provisional application No. 62/531,224, filed on Jul. 11, 2017.

(51) Int. Cl.
*H03M 7/30* (2006.01)
*H03M 13/00* (2006.01)
*G06F 11/10* (2006.01)
*H03M 7/40* (2006.01)
*H03M 13/37* (2006.01)

(52) U.S. Cl.
CPC .............. *H03M 7/70* (2013.01); *G06F 11/10* (2013.01); *H03M 7/4031* (2013.01); *H03M 13/6312* (2013.01); *H03M 7/6023* (2013.01); *H03M 13/3761* (2013.01)

(58) Field of Classification Search
CPC .............. H03M 13/3612; H03M 7/70; H03M 13/3761; H03M 13/1102; H03M 13/1515; H03M 7/4031; H03M 13/6312; G06F 11/10; G06F 11/1076; G06F 11/1004; G06F 19/22; G06F 19/28
See application file for complete search history.

(56) References Cited

U.S. PATENT DOCUMENTS

2015/0261664 A1    9/2015 Goldman et al.
2017/0187390 A1    6/2017 Le Scouarnec et al.

FOREIGN PATENT DOCUMENTS

CA    2874540 A1 * 12/2013 ............. G06F 19/00

OTHER PUBLICATIONS

Heckel et al., Fundamental limits of DNA storage systems, May 12,University of California, Berkeley, (retrieved from google.com Sep. 24, 2019). (Year: 2017).*

* cited by examiner

*Primary Examiner* — Shelly A Chase
(74) *Attorney, Agent, or Firm* — Erik A. Huestis; Foley Hoag LLP

(57) ABSTRACT

Efficient encoding and decoding of data for storage in polymers is provided. In various embodiments, an input file is read. The input file is segmented into a plurality of segments. A plurality of packets is generated from the plurality of segments by applying a fountain code. Each of the plurality of packets is encoded as a sequence of monomers. The sequences of monomers are screened against at least one constraint. An oligomer is outputted corresponding to each sequence that passes the screening.

15 Claims, 20 Drawing Sheets

Specification includes a Sequence Listing.

| Size | Type | Name |
|---|---|---|
| 62 byte | Text | amazon_gift_card.tab |
| 1.4 Mbyte | Operating system | kolibri.iso |
| 53 Kbyte | Image | pioneer.svg |
| 343 Kbyte | PDF | shannon.pdf |
| 523 Kbyte | Movie | the_arrival_of_a_train.3pg |
| 42 Kbyte | Malware | zipbomb | tar.gz: 2.14Mbyte

Fig. 2

SEQUENCE LISTING

```
<160> NUMBER OF SEQ ID NOS: 4

<210> SEQ ID NO 1
<211> LENGTH: 6
<212> TYPE: PRT
<213> ORGANISM: Artificial Sequence
<220> FEATURE:
<223> OTHER INFORMATION: synthetic peptide

<400> SEQUENCE: 1
```

```
Ala Ala Ala Ala Ala Ala
1               5

<210> SEQ ID NO 2
<211> LENGTH: 199
<212> TYPE: DNA
<213> ORGANISM: Artificial Sequence
<220> FEATURE:
<223> OTHER INFORMATION: synthetic primer
<220> FEATURE:
<221> NAME/KEY: misc_feature
<222> LOCATION: (27)..(178)
<223> OTHER INFORMATION: n is a, c, g, or t

<400> SEQUENCE: 2
gttcagagtt ctacagtccg acgatcnnnn nnnnnnnnnn nnnnnnnnnn nnnnnnnnnn    60
nnnnnnnnnn nnnnnnnnnn nnnnnnnnnn nnnnnnnnnn nnnnnnnnnn nnnnnnnnnn   120
nnnnnnnnnn nnnnnnnnnn nnnnnnnnnn nnnnnnnnnn nnnnnnnnnn nnnnnnnntg   180
gaattctcgg gtgccaagg                                                199

<210> SEQ ID NO 3
<211> LENGTH: 50
<212> TYPE: DNA
<213> ORGANISM: Artificial Sequence
<220> FEATURE:
<223> OTHER INFORMATION: synthetic primer

<400> SEQUENCE: 3
aatgatacgg cgaccaccga gatctacacg ttcagagttc tacagtccga                50

<210> SEQ ID NO 4
<211> LENGTH: 63
<212> TYPE: DNA
<213> ORGANISM: Artificial Sequence
<220> FEATURE:
<223> OTHER INFORMATION: synthetic primer

<400> SEQUENCE: 4
caagcagaag acggcatacg agatcgtgat gtgactggag ttccttggca cccgagaatt    60
cca                                                                 63
```

EFFICIENT ENCODING OF DATA FOR STORAGE IN POLYMERS SUCH AS DNA

CROSS-REFERENCE TO RELATED APPLICATIONS

This application claims the benefit of U.S. Provisional Application No. 62/531,224, filed Jul. 11, 2017, the entire contents of which is hereby incorporated by reference.

SEQUENCE LISTING

The instant application contains a Sequence Listing which has been submitted in ASCII format via EFS-Web and is hereby incorporated by reference in its entirety. Said ASCII copy, created on Sep. 24, 2018, is named YEI-101_ST25.txt and is 4 KB in size.

BACKGROUND

Embodiments of the present disclosure relate to data encoding and decoding algorithms, and more specifically, to the efficient encoding of data for storage in polymers, such as DNA, RNA, or proteins, and decoding of data previously stored in such polymers.

BRIEF SUMMARY

According to embodiments of the present disclosure, methods of, systems for, and computer program products for encoding data for storage in polymers, such as DNA are provided. In various embodiments, an input file is read. The input file is segmented into a plurality of segments. A plurality of packets is generated from the plurality of segments by applying a fountain code. Each of the plurality of packets is encoded as a sequence of monomers. The sequences of monomers are screened against at least one constraint. An oligomer is outputted corresponding to each sequence that passes the screening.

According to other embodiments of the present disclosure, methods of, systems for, and computer program products for decoding data for storage in DNA are provided. In various embodiments, a plurality of oligomers is determined by sequencing a sample. Each of the plurality of oligomers comprises a sequence of monomers. A plurality of packets is determined from the plurality of oligomers by mapping monomers to values. A plurality of file segments is recovered from the plurality of packets by applying a fountain decode. A file is assembled from the plurality of file segments.

BRIEF DESCRIPTION OF THE SEVERAL VIEWS OF THE DRAWINGS

FIG. 2 illustrates exemplary input files to algorithms according to embodiments of the present disclosure.

DETAILED DESCRIPTION

Figure 1:
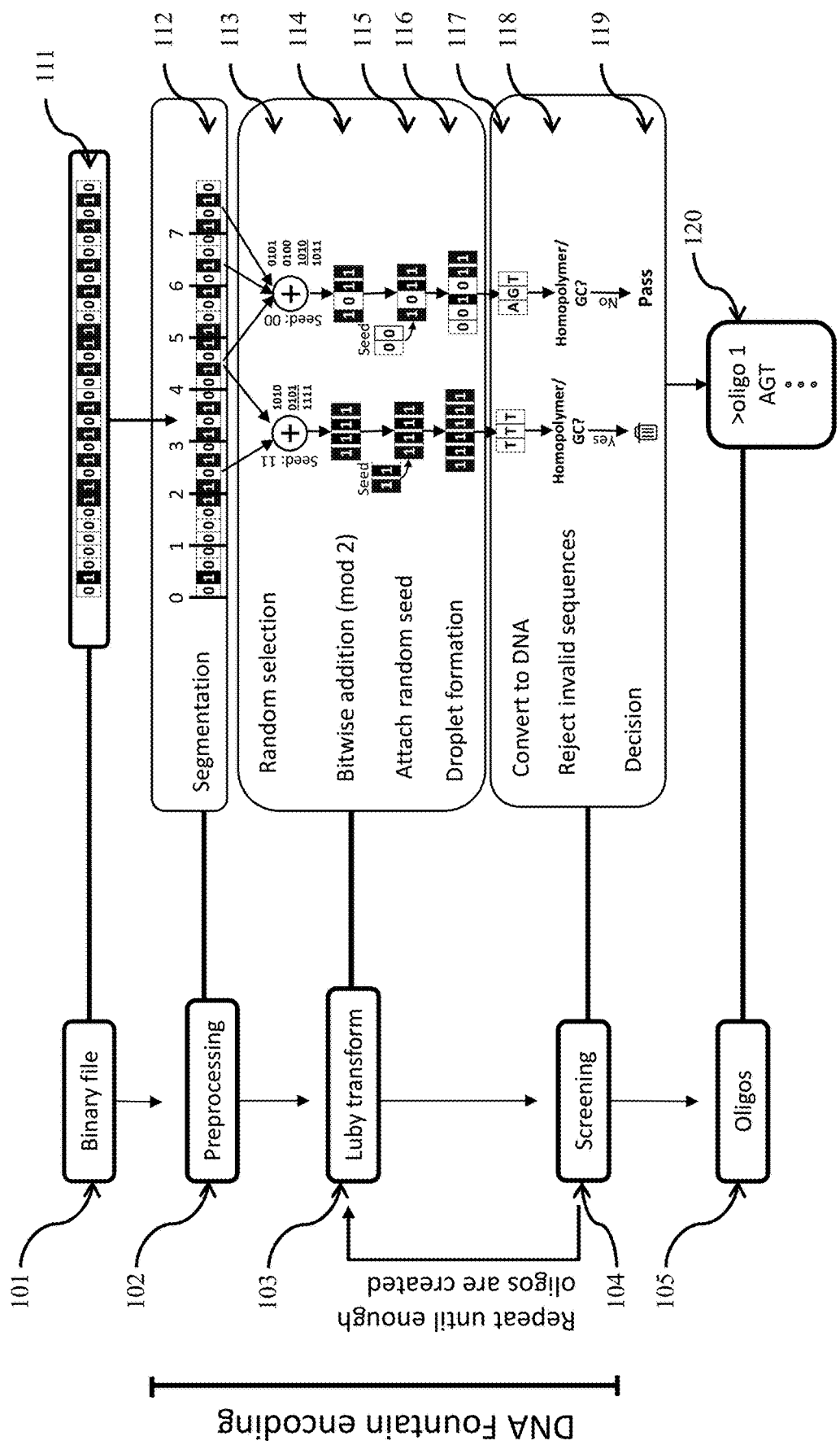
FIG. 1 illustrates the steps of an encoding algorithm according to embodiments of the present disclosure.

Polymers such as DNA are attractive media to store digital information. The present disclosure provides storage strategies, which may be referred to as DNA Fountain, that are highly robust and approach the information capacity per monomer. In an exemplary embodiment, a full computer operating system, movie, and other files with a total of $2.14 \times 10^6$ bytes are stored in DNA oligos and retrieved without error from a sequencing coverage equivalent of a single tile of Illumina sequencing. A processes are provided that allow $2.18 \times 10^{15}$ retrievals using the original DNA sample and are able to decode the data without error. In another exemplary embodiment, retrieval is demonstrated from a density of 215 Petabyte/gram of DNA.

Humanity is currently producing data at exponential rates, creating a demand for better storage devices. Polymers such as DNA are excellent media for data storage with information density of petabytes of data per gram, high durability, and evolutionarily optimized machinery to faithfully replicate this information.

The Shannon information capacity of polymers sets a tight upper bound on the amount of information that can be reliably stored in each monomer. For example, in the case of DNA in an ideal world, the information capacity of each nucleotide could reach 2 bits, since there are four possible options. However, DNA encoding faces several practical limitations. First, not all DNA sequences are created equal. Biochemical constraints dictate that DNA sequences with high GC content or long homopolymer runs (e.g., AAAAAA . . . ) (SEQ ID NO: 1) should be avoided as they are difficult to synthesize and prone to sequencing errors. Second, oligo synthesis, PCR amplification, and decay of DNA during storage can induce uneven representation of the oligos. This might result in dropout of a small fraction of oligos that will not be available for decoding. In addition to biochemical constraints, oligos are sequenced in a pool and necessitate indexing to infer their order, which further limits the number of available nucleotides for encoding information. Quantitative analysis shows that the biochemical constraints reduce the coding potential of each nucleotide to 1.98 bits. After combining the expected dropout rates and barcoding demand, the overall Shannon information capacity of a DNA storage device is around 1.83 bits per nucleotide for a range of practical architectures. This is further illustrate below with reference to FIGS. 7-12 and Table 4 and Table 5.

Previous studies of DNA storage realized about half of the Shannon information capacity of DNA molecules and in some cases reported challenges to perfectly retrieve the information. Comparative metrics are illustrated in Table 1, with reference to: G. M. Church, Y. Gao, S. Kosuri, Next-generation digital information storage in DNA. Science. 337, 1628 (2012); N. Goldman et al., Towards practical, high-capacity, low-maintenance information storage in synthesized DNA. Nature. 494, 77-80 (2013); R. N. Grass, R. Heckel, M. Puddu, D. Paunescu, W. J. Stark, Robust Chemical Preservation of Digital Information on DNA in Silica with Error-Correcting Codes. Angew. Chem. Int. Ed. 54, 2552-2555 (2015); J. Bornholt et al., in Proceedings of the Twenty-First International Conference on Architectural Support for Programming Languages and Operating Systems (ACM, 2016), pp. 637-649; and M. Blawat et al., Forward Error Correction for DNA Data Storage. Procedia Comput. Sci. 80, 1011-1022 (2016).

TABLE 1

|  | Church et al. | Goldman et al. | Grass et al. | Bornholt et al. | Blawat et al. | This work |
|---|---|---|---|---|---|---|
| Input data [Mbyte] | 0.65 | 0.75 | 0.08 | 0.15 | 22 | 2.15 |
| Coding potential [bits/nt] | 1 | 1.58 | 1.78 | 1.58 | 1.6 | 1.98 |
| Redundancy | 1 | 4 | 1.12 | 1.5 | 1.13 | 1.07 |
| Robustness to dropouts | No | Repetition | RS | Repetition | RS | Fountain |
| Error correction/detection | No | Yes | Yes | No | Yes | Yes |
| Full recovery | No | No | Yes | No | Yes | Yes |
| Net information density [bits/nt] | 0.83 | 0.33 | 1.14 | 0.88 | 0.92 | 1.57 |
| Realized capacity | 45% | 18% | 62% | 48% | 50% | 86% |
| Physical density [PB/g] | 1.28 | 2.25 | 0.005 | — | — | 214 |

Table 1 describes schemes that were empirically tested with pooled oligo synthesis and high throughput sequencing data. The schemes are presented chronologically on the basis of date of publication. Coding potential is the maximal information content of each nucleotide before indexing or error correcting. Redundancy denotes the excess of synthesized oligos to provide robustness to dropouts. Robustness to dropouts denotes the proposed strategy to recover oligo dropouts. Error correction/detection denotes the presence of error correcting/detection code to handle synthesis and sequencing errors. Full recovery indicates whether all information was recovered without any error. Net information density indicates the input information in bits divided by the number of overall DNA bases requested for sequencing (excluding adapter annealing sites). Realized capacity is the ratio between the net information density and the Shannon Capacity of the channel. Physical density is the actual ratio of the number of bytes encoded and minimal weight of the DNA library used to retrieve the information.

For example, two previous studies attempted to address oligo dropout by dividing the original file into overlapping segments so that each input bit is represented by multiple oligos. However, this repetitive coding procedure generates a loss of information content and is poorly scalable (as discussed further below with regard to FIGS. 13-14). In both cases, these studies reported small gaps in the retrieved information. Other studies explored the usage of Reed-Solomon (RS) code on small blocks of the input data in order to recover dropouts. These studies were far from realizing the theoretical capacity. Moreover, testing this strategy on a large file size highlights difficulties in decoding the data due to local correlations and large variations in the dropout rates within each protected block, which is a known issue of blocked RS codes. Only after employing a complex multi-step procedure and high sequencing coverage, the study was able to rescue a sufficient number of oligos.

To overcome these and other drawbacks of the prior art, the present disclosure provides a coding strategy that can better utilize the information capacity of DNA storage devices while showing higher data retrieval reliability.

Referring now to FIG. 1, an encoding algorithm according to embodiments of the present disclosure is illustrated (which may be referred to as DNA Fountain encoding). A binary file 101 is preprocessed 102. A Luby transform 103 is applied. The results are screened 104, and the process is repeated until enough oligos are created. The result is a plurality of oligos 105, encoding portions of the file 101. An example 32 bit file 111 is illustrated as it passes through the encoding steps 101 . . . 105. For simplicity, the file is partitioned into 8 segments of 4 bits 112. The seeds are represented as 2 bit numbers and are presented for display purposes only. The steps of the Luby transform 113-116 are illustrated. It will be appreciated that although various embodiments are described with relation to LT code, alternative optimal or near-optimal fountain codes may be applied in accordance with the present disclosure. Likewise, it will be appreciated that certain other optimal or near-optimal erasure codes are suitable for use in accordance with the present disclosure. After droplet formation 116, the encoded data is converted to DNA 117. Invalid sequences are rejected 118, and a final decision is made.

Strategies for DNA storage devices according to the present disclosure approach the Shannon capacity while providing strong robustness against data corruption. Fountain codes are used to allow reliable and effective unicasting of information over channels that are subject to dropouts. In embodiments of the present disclosure, fountain codes are applied to overcome both oligo dropouts and the biochemical constraints of DNA storage. As outlined above with regard to FIG. 1, three primary encoding steps are provided. A binary file is preprocessed into a series of non-overlapping segments of a certain length 102, 112. Two computational steps are iterated over: Luby Transform 103 and screening 104. The Luby Transform sets the basis for fountain codes. It packages data into any desired number of short messages, called droplets, by selecting a random subset of segments 113 from the file using a special distribution (discussed further below with regard to FIG. 15) and adding them bitwise together 114 under a binary field. The droplet 116 contains two pieces of information: a data payload part that holds the result of the addition procedure and a short, fixed-length seed 115. This seed corresponds to the state of the random number generator of the transform during the droplet creation and allows the decoder algorithm to infer the identities of the segments in the droplet.

Reversing the Luby Transform to recover the file is possible using a highly efficient algorithm by collecting any subset of droplets as long as the accumulated size of droplets is slightly bigger than the size of the original file. In various embodiments, one round of the transform is applied in each iteration to create a single droplet. Next, the algorithm moves to the droplet screening stage 104. It completely realizes the coding potential of each nucleotide under the biochemical constraints to reach 1.98 bit/nt. In screening, the algorithm translates the binary droplet to a DNA sequence by converting {00, 01, 10, 11} to {A, C, G, T}, respectively (although it will be appreciated that other conversions may be applied according to embodiments of the present disclosure). The sequence is screened 118 for the desired biochemical properties of GC content and homopolymer runs. If the sequence passes the screen, it is considered valid and added to the oligo design file 120; otherwise, the algorithm simply trashes the droplet. Since the Luby Transform can create any desired number of droplets, the creation and screening steps are repeated until a sufficient number of valid oligos are generated. In some embodiments, about 5% to about 10% more oligos than input segments are generated. However, it will be appreciated that any oligo ratio may be employed, for example, 100% more than input segments. Searching for valid oligos scales well with the size of the input file and is economical for various oligo lengths within and beyond current synthesis limits (as illustrated below with regard to Table 5).

Figure 3:
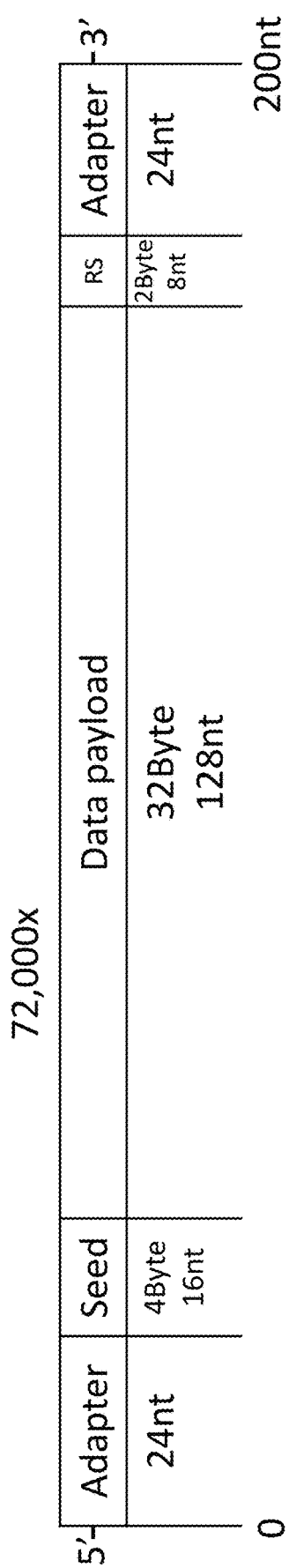
FIG. 3 an oligo structure according to embodiments of the present disclosure.
Figure 16:
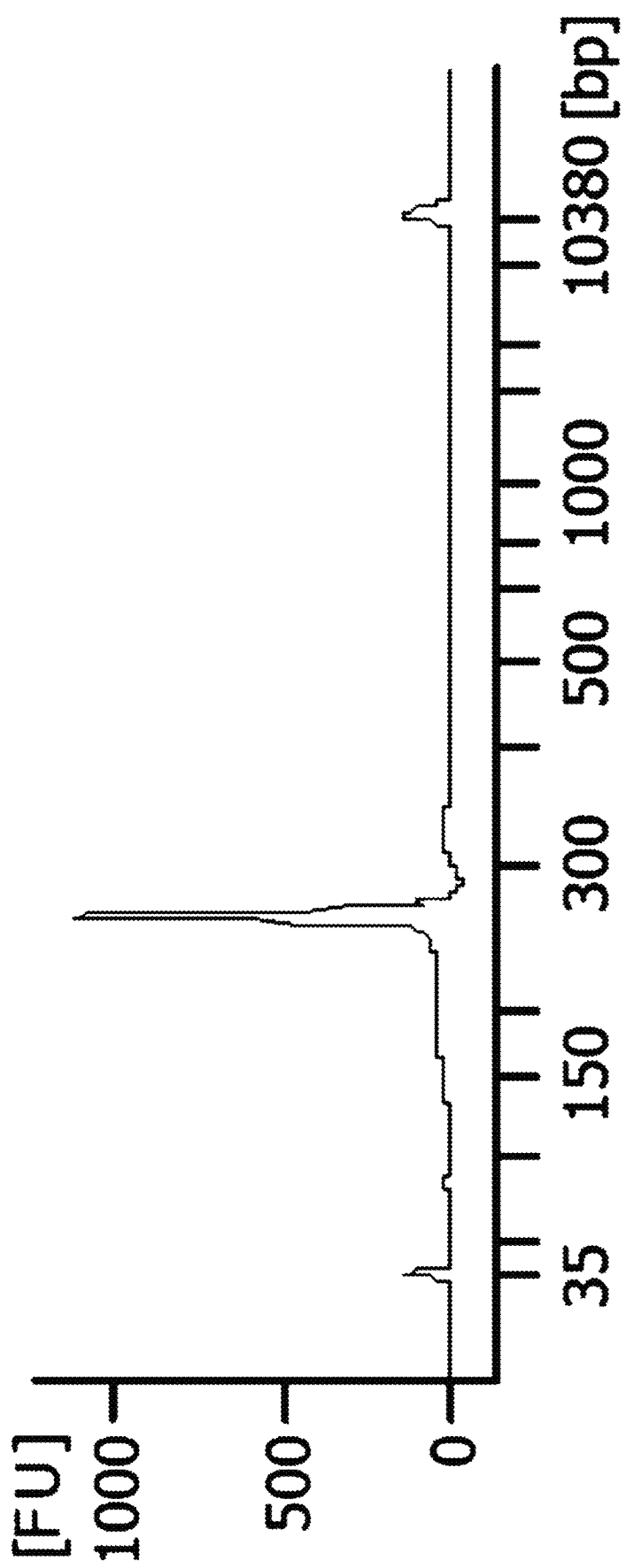
FIG. 16 illustrates average fragment size according to embodiments of the present disclosure.

FIG. 2 illustrates exemplary input files including size and type. The total amount of data was 2.14 Mbyte after compression. In an exemplary embodiment, encoding according to the present disclosure is used to encode a single compressed file of 2,146,816 bytes in a DNA oligo pool. The input data is a tarball that packages several files, including a complete graphical operating system of 1.4 Mbyte and a $50 Amazon gift card (FIG. 2). The input tarball is split into 67,088 segments of 32 bytes and iterated over the steps of the algorithms described herein to create valid oligos. Each droplet is 38 bytes (304 bits): 4 bytes of the random number generator seed, 32 bytes for the data payload, and 2 bytes for a Reed-Solomon error correcting code, to reject erroneous oligos in low coverage conditions. With this seed length, encoding of files of up to 500 Mbytes is supported. The DNA oligos in this example have a length of (304/2)=152 nt and are screened for homopolymer runs of ≤3 nt and GC content of 45%-55%. 72,000 oligos are generated, yielding a redundancy of (72,000/67,088−1)=7%. This number of oligos correlates with the price structure offered by the manufacturer, allowing cost optimization, but it will be appreciated that any number of oligos may be used according to the present disclosure. Upstream and downstream annealing sites are added for Illumina adapters, making the final oligos 200 nt long (as illustrated in FIGS. 3, 16). In this example, encoding takes 2.5 min on a single CPU of a standard laptop. An information density of 1.57 bit/nt is achieved, only 14% from the Shannon capacity of DNA storage and 60% more than previous studies (Table 1). In FIG. 3, lengths are given in bytes and nucleotides, while RS corresponds to the Reed-Solomon error correcting code.

In various embodiments, encoding may be conducted in parallel to achieve greater speed on multi-processor systems. In some such embodiments, N encoding threads are run in parallel on the same file. Each encoding thread n: 0 . . . N−1 traverses a predetermined seed schedule, such as that described herein, to generate a seed value $s_n$. If $s_n$ mod N=n, the encoding thread tries to create a droplet, if not it passes to the next seed. In this way, the algorithm creates droplets in parallel without recurrence.

Figure 4:
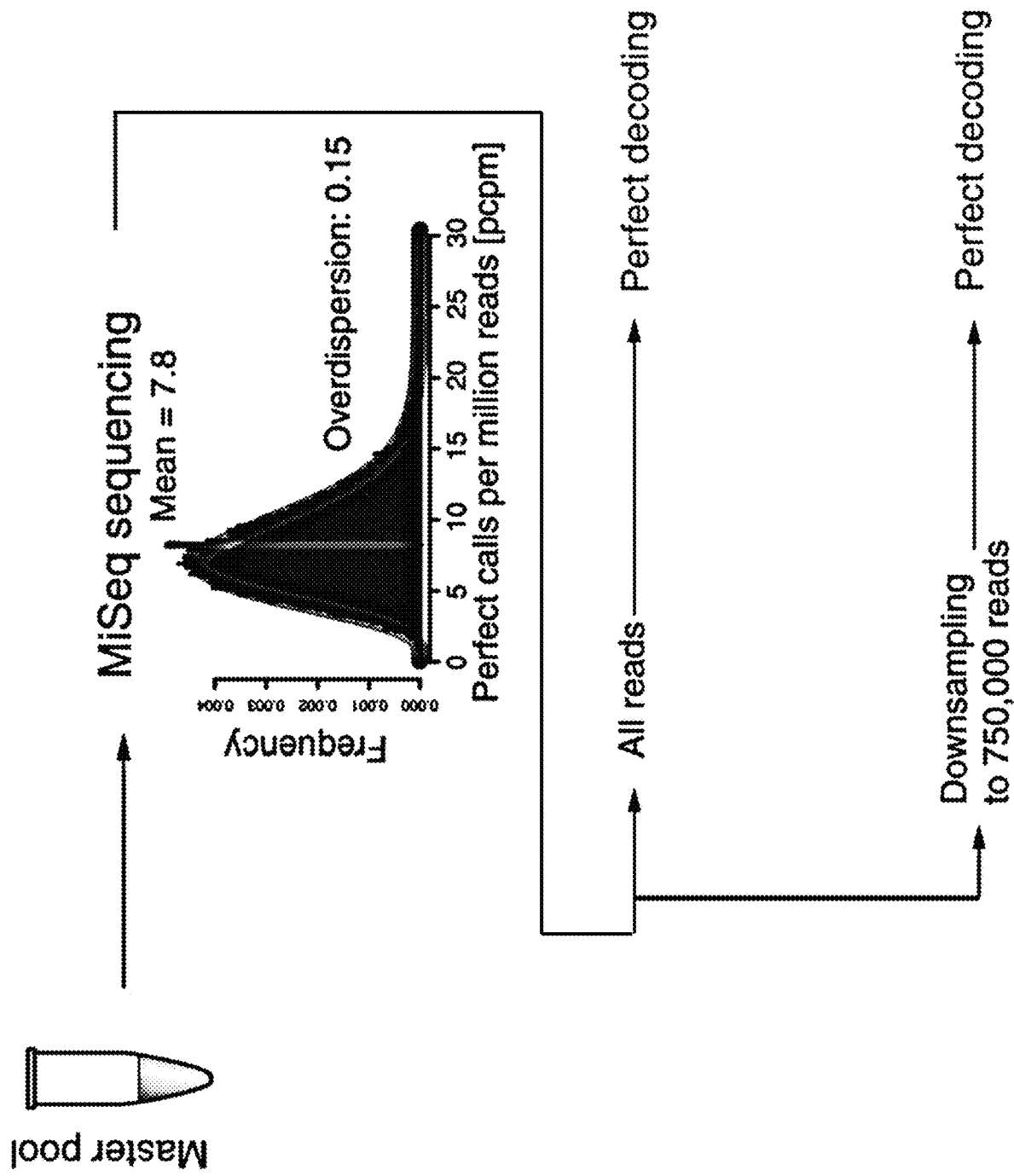
FIG. 4 illustrates the frequency of perfect calls per million (pcpm) sequenced reads of an exemplary embodiment of the present disclosure.

As illustrated in FIG. 4, sequencing and decoding the oligo pool fully recovers the entire input file with zero errors. The histogram displays the frequency of perfect calls per million (pcpm) sequenced reads. To retrieve the information, the oligo pool is PCR-amplified and the DNA library is sequenced on one MiSeq flowcell with 150 paired-end cycles, which yields 32 million reads. A pre-processing strategy may be employed that prioritizes reads that are more likely to represent high quality oligos. Since not all oligos are required for the decoding due to redundancy, this procedure reduces the exposure to erroneous oligos. Then, the decoder scans the reads, recovers the binary droplets, rejects droplets with errors based on the Reed-Solomon code, and employs a message passing algorithm to reverse the Luby Transform and obtain the original data.

In various embodiments, the sequence reads are sorted based on their abundance. In such embodiments, decoding starts with the most abundant read and progresses to the least abundant read. In this way, the most-high quality oligos are prioritized and the erroneous oligos are de-prioritized.

In some embodiments, as described above, a Reed-Solomon (RS) code is included on each oligo. In such embodiments, the RS code may be used to detect erroneous reads or to correct them.

In some embodiments, a k-mer correction strategy is additionally applied as a preprocessing step to remove sequence errors. One example of a suitable k-mer correction strategy is Quake, described in Kelley, et al., Quake: quality-aware detection and correction of sequencing errors, Genome Biology11:R116, 2010 (available at https://genomebiology.biomedcentral.com/articles/10.1186/gb-2010-11-11-r116). Quake utilizes a robust mixture model of erroneous and genuine k-mer distributions to determine where errors are located. Then Quake uses read quality values and learns the nucleotide to nucleotide error rates to determine what types of errors are most likely.

Figure 13:
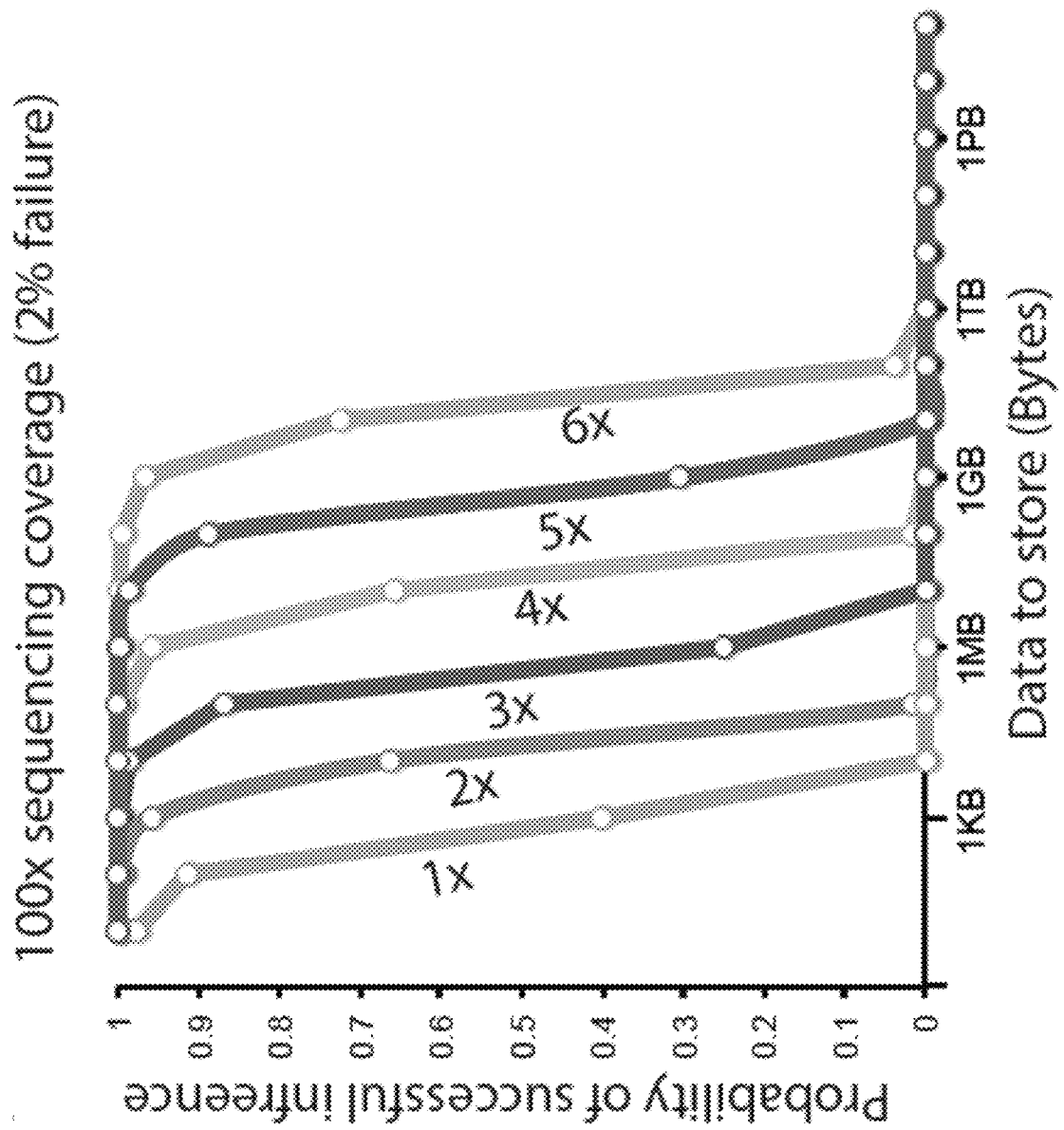
FIGS. 13-14 illustrate probability of perfect retrieval of information as a function of input size according to embodiments of the present disclosure.

In this example, decoding takes approximately 9 min with a Python script on a single CPU of a standard laptop. The decoder recovered the information with 100% accuracy after observing only 69,870 oligos out of the 72,000 in the library (as illustrated in FIG. 13). To further test the robustness of this strategy, the raw Illumina data is downsampled to 750,000 reads, equivalent to one tile of an Illumina MiSeq flow cell. This procedure resulted in 1.3% oligo dropout from the library. Despite these limitations, the decoder is able to perfectly recover the original 2.1 Mbyte in twenty out of twenty random down-sampling experiments. These results indicate that beyond its high information density, the techniques described herein also reduce the amount of sequencing required for data retrieval, which is beneficial when storing large-scale information.

Figure 5:
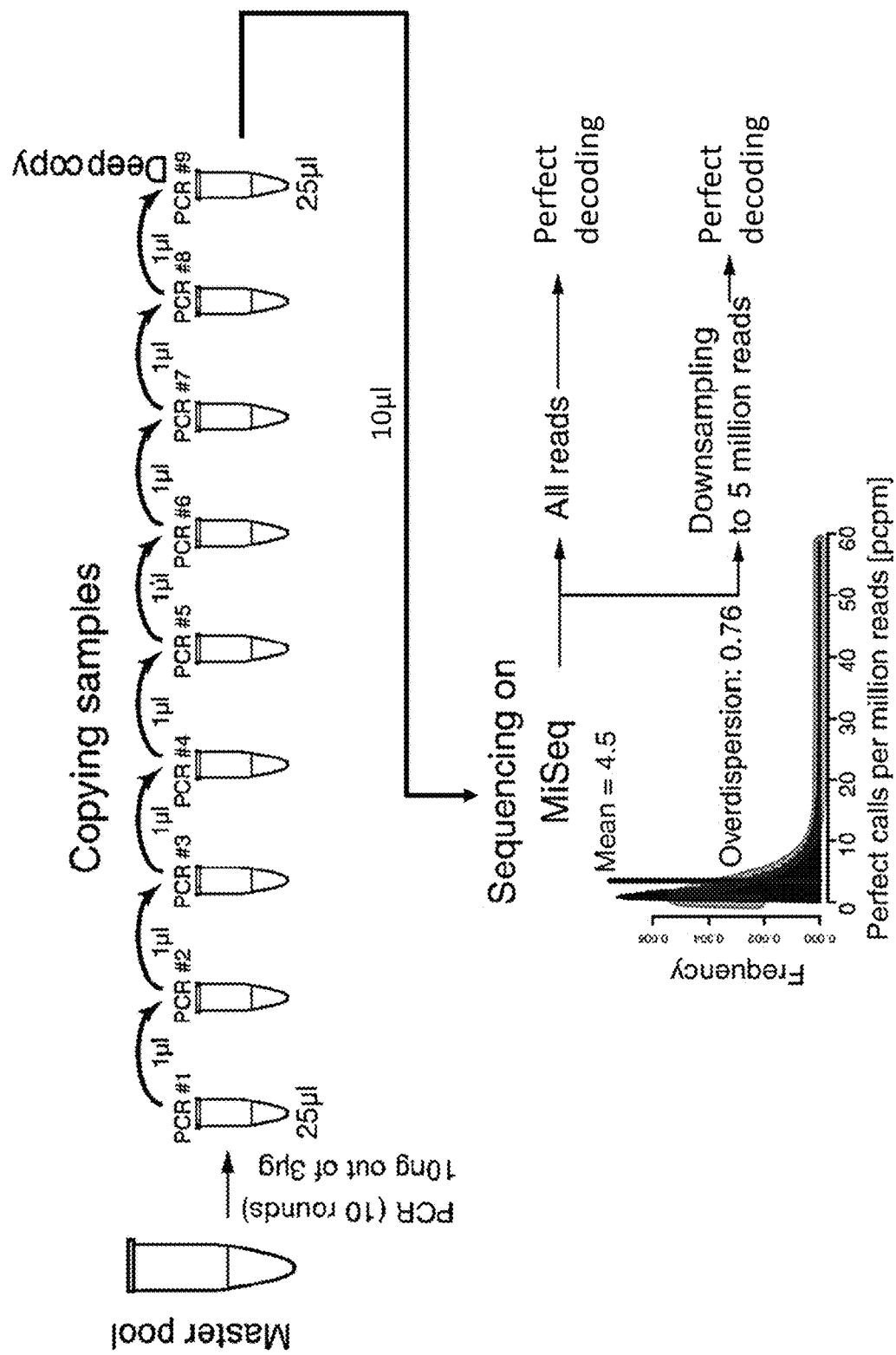
FIG. 5 illustrates deep copying of the oligo pool in an exemplary embodiment of the present disclosure.

Referring to FIG. 5, the techniques described herein can also perfectly recover a file after creating a deep copy of the sample. One of the caveats of DNA storage is that each retrieval of information consumes an aliquot of the material. Copying the oligo library with PCR is possible, but this procedure introduces noise and induces oligo dropout. In one illustrative example, to further test the robustness of the techniques described herein, a deep copy of the file is created by propagating the sample through nine serial PCR amplifications. The first PCR reaction used 10 ng of material out of the 3 ug master pool. Each subsequent PCR reaction consumed 1 ul of the previous PCR reaction and employed 10 cycles in each 25 ul reaction. In this example, the final library is sequenced using one run on the Illumina MiSeq.

Figure 18:
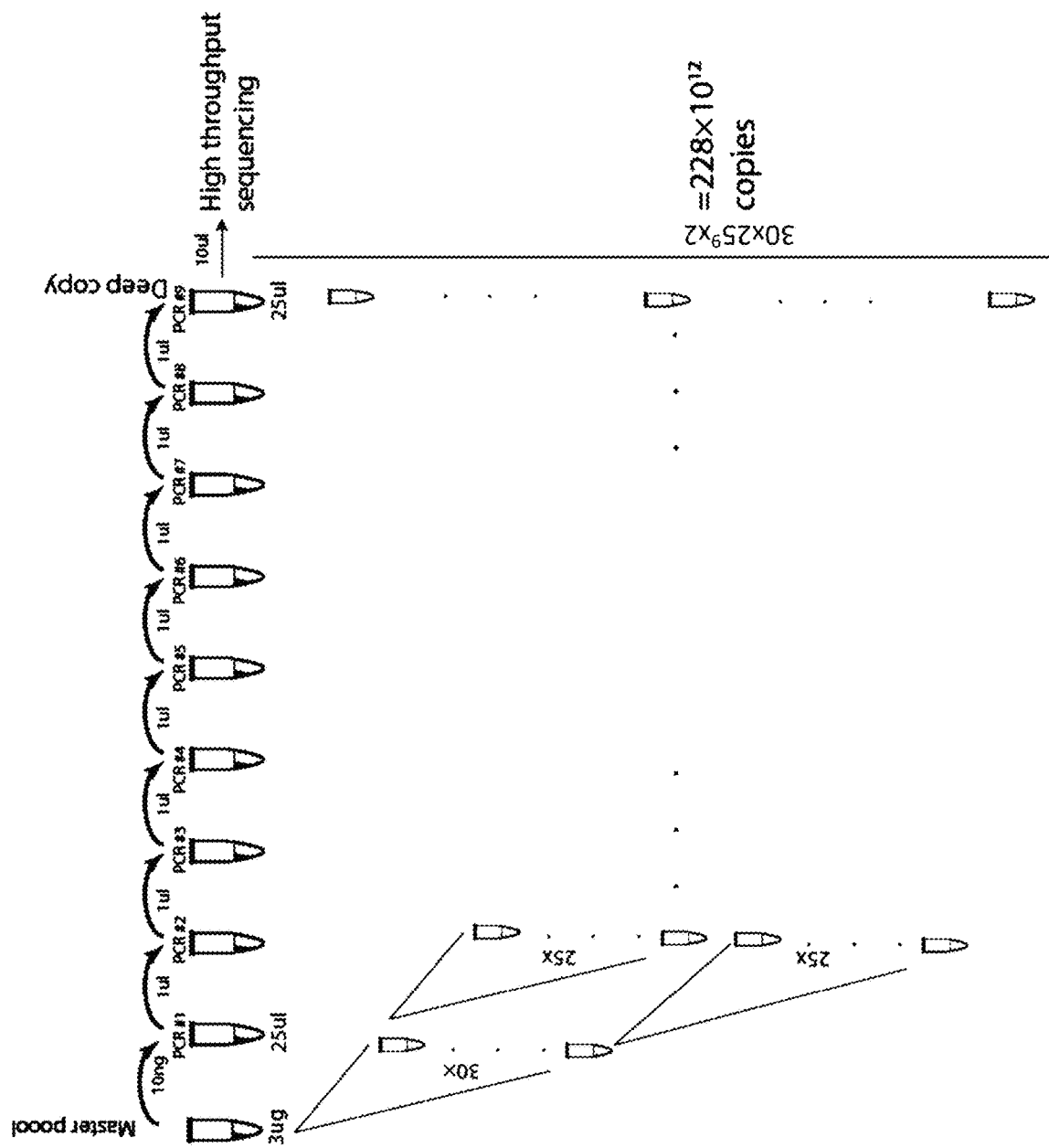
FIG. 18 illustrates an exponential amplification process according to embodiments of the present disclosure.

Overall, this recursive PCR reflects one full arm of an exponential process that theoretically could generate 300×25$^9$×2=2.28 quadrillion copies of the file by repeating the same procedure with each aliquot (as illustrated in FIG. 18). As expected, the quality of the deep copy is worse than the initial experiment with the master pool. The average coverage per oligo drops from an average of 7.8 perfect calls for each oligo per million reads (pcpm) to 4.5 pcpm in the deep copy. In addition, the deep copy shows much higher skewed representation with a negative binomial overdispersion parameter (1/size) of 0.76 compared to 0.15 in the master pool. Despite the lower quality, the decoder is able to fully recover the file without a single error with the full sequencing data. After down-sampling the sequencing data to five million reads, and an approximate dropout rate of 1.0%, the file is recoverable in ten out of ten trials. These results suggest that with the techniques described herein, DNA storage can be copied virtually an unlimited number of times while preserving the data integrity of the sample.

DNA storage could achieve an information density of 680 Pbyte (P: peta-; $10^{15}$) per gram of DNA, assuming the storage of 100 molecules per oligo sequence. However, previous DNA storage experiments have never attempted to reach this high density and in practice tested data retrieval from libraries with densities that are lower by a factor of at least 300× (as illustrated in Table 1).

Figure 6:
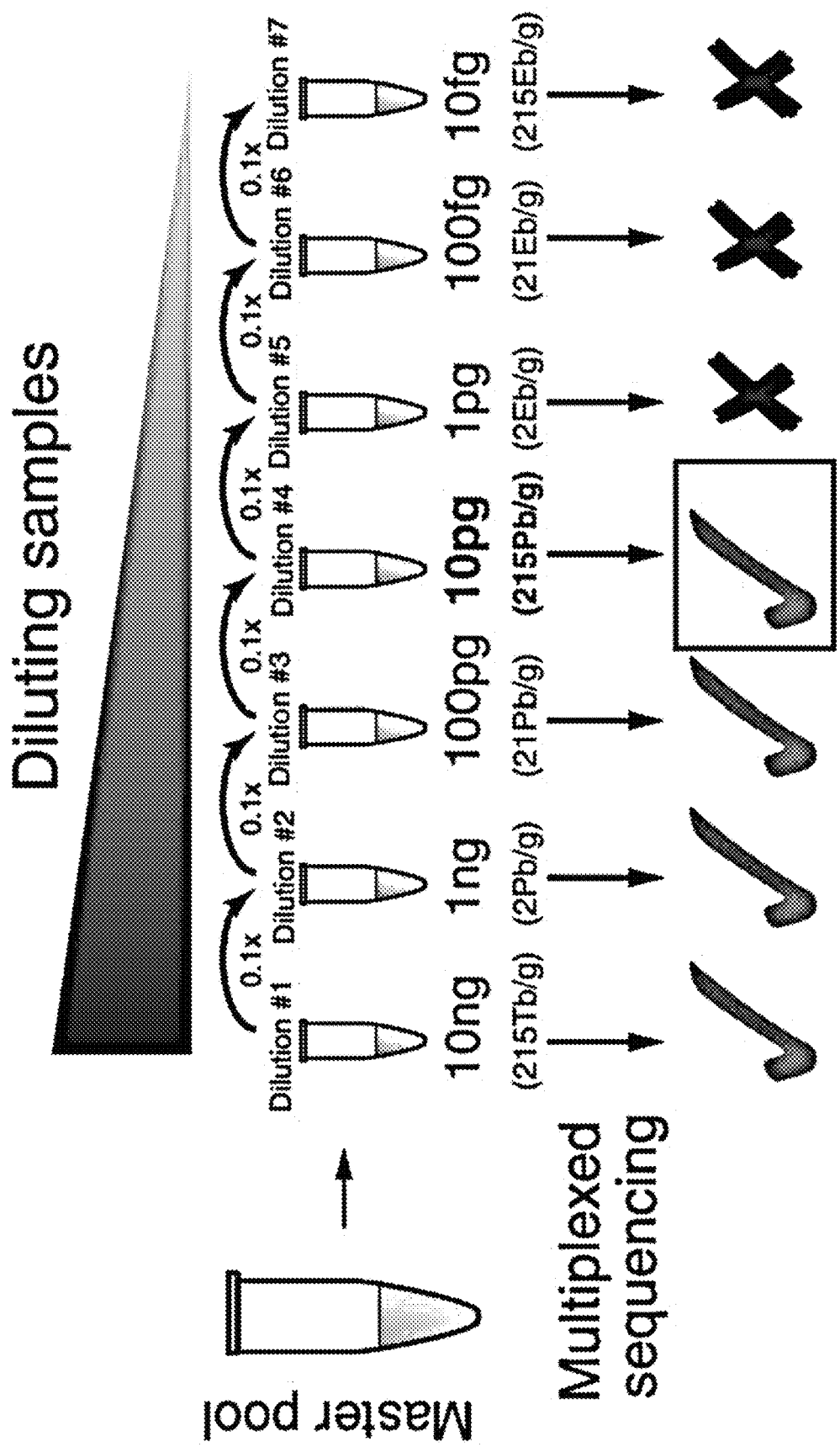
FIG. 6 illustrates serial dilution in an exemplary embodiment of the present disclosure.

Referring to FIG. 6, serial dilution is illustrated of a library by seven orders of magnitude from 10 ng of DNA to 10 fg (femtogram; $10^{15}$) of DNA. The weight corresponds to the input DNA library that underwent PCR and sequencing. Correct decoding is indicated by a check, while a decoding failure is indicated by an X. Under a perfect synthesis process (without synthesis errors and/or fragmented DNA molecules), the first dilution (10 ng) corresponds to ~$10^6$ copies per oligo and a density of ~2 Tbyte/g, whereas the last dilution corresponds to ~1 copy per oligo and ~200 Ebyte/g (E: exa-; $10^{18}$). In this example, all libraries are PCR amplified using an identical strategy to keep all conditions uniform and the libraries are sequenced using two multiplexed Illumina rapid runs, which yield similar number of reads and quality metrics.

The information may then be perfectly retrieved from a physical density of 215 Pb/g. This density is over two orders of magnitude higher than previous reports and close to the theoretical limit. At this density, the input weight of the library is 10 pg and each oligo is represented by approximately 1300 molecules on average. About a 4% dropout rate is observed. For the lower input weights, the libraries have substantially more oligo dropouts, ranging from 62% for the 1 pg condition (~2 Ebyte/g) to 87% for the 10 fg condition (~200 Ebyte/g). A more aggressive error correcting capability is unlikely to dramatically improve the physical density. Even decoding of the low-weight libraries (<10 pg) under the assumption of a decoder that can correct any number of indels and substitutions as long as a very short stretch (15 nt) of the read is still intact, fails to bring the dropout rates of the 1 pg library below 30%. Therefore, these results suggest that the current design gets close to the maximal physical density permitted by the stochastic bottleneck induced by PCR amplification of highly complex libraries using a small number of DNA molecules.

TABLE 2

| | Dilution | | | | | | |
|---|---|---|---|---|---|---|---|
| | 1 | 2 | 3 | 4 | 5 | 6 | 7 |
| Total weight [ng] | 10 | 1 | 0.1 | 0.01 | 0.001 | 0.0001 | 0.00001 |
| Total molecules | $9.21 \times 10^{10}$ | $9.21 \times 10^9$ | $9.21 \times 10^8$ | $9.21 \times 10^7$ | $9.21 \times 10^6$ | $9.21 \times 10^5$ | $9.21 \times 10^4$ |
| Molecules per sequence | $1.3 \times 10^6$ | $1.3 \times 10^5$ | $1.3 \times 10^4$ | $1.3 \times 10^3$ | $1.3 \times 10^2$ | $1.3 \times 10$ | 1.3 |
| Density [byte/g] | $2.14 \times 10^{14}$ | $2.14 \times 10^{15}$ | $2.14 \times 10^{16}$ | $2.14 \times 10^{17}$ | $2.14 \times 10^{18}$ | $2.14 \times 10^{19}$ | $2.14 \times 10^{20}$ |
| Total reads | 40,843,415 | 76,865,956 | 66,855,708 | 65,706,638 | 55,996,408 | 62,050,438 | 63,510,382 |
| Reads assembled | 93% | 95% | 97% | 94% | 94% | 94% | 84% |
| o.o.w. length 152 nt | 66% | 67% | 70% | 67% | 68% | 69% | 65% |
| o.o.w. valid oligos | 89% | 90% | 89% | 89% | 90% | 90% | 90% |
| Reads passed all stages | 45% | 43% | 40% | 44% | 42% | 42% | 50% |
| Recovered oligos | 72,000 | 72,000 | 71,998 | 69,407 | 27,379 | 14,194 | 9,651 |
| Missing oligos | 0% | 0% | 0% | 4% | 62% | 80% | 87% |
| Mean coverage | 311 | 611 | 559 | 511 | 448 | 501 | 439 |
| Size | 7.49 | 7.46 | 4.33 | 0.97 | 0.06 | 0.02 | 0.01 |

In Table 2, total molecules were calculated based on dividing the total weight by the expected weight for 200 nt single-strand DNA: $1.0688 \times 10^{-19}$ gr/molecule. Molecules per sequence is the number of molecules divided by 72,000, the total number of synthesized oligos. Reads assembled is the fraction of PE reads that were assembled by PEAR. Mean coverage is the average number of reads per valid oligo. Size is the size parameter (overdispersion−1) of the negative bionomial distribution. (o.o.w.=out of which)

A persistent issue in polymer storage is the high cost of synthesis. However, these costs reflect the relatively low throughput of manufacturing high quality oligos for traditional synthetic biology applications that are sensitive to errors. This is not the case for polymer storage. As described herein, perfect decoding of data is possible from conditions that are well below the initial quality and quantity of oligo manufacturers while still approaching the information capacity. With these results, cost-effective polymer storage may be provided that relies on faster and lower quality oligo synthesis that consumes less machine time. The techniques described herein handle the chemical imperfections using strong information-theoretic tools.

Figure 7:
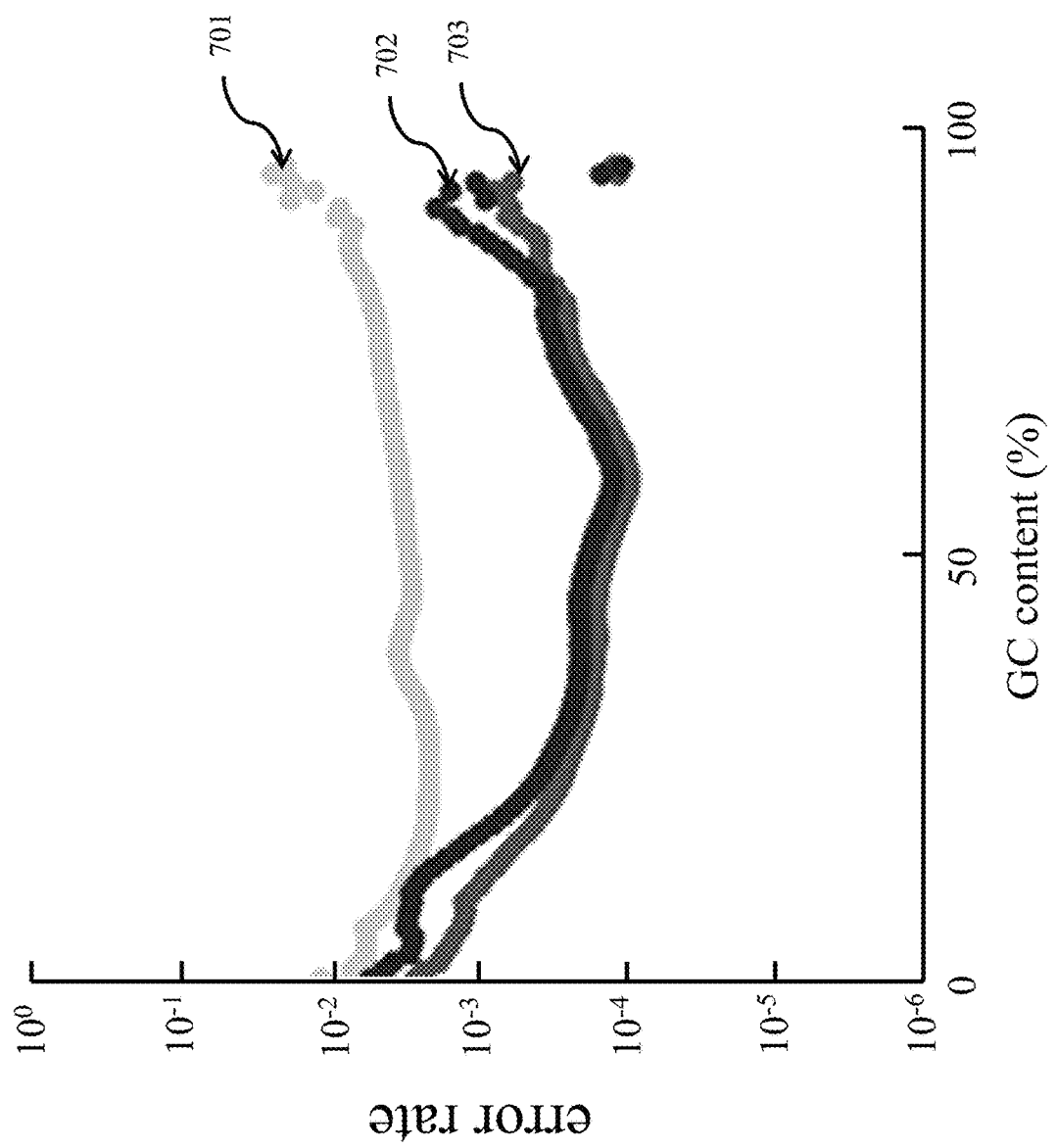
FIGS. 7-8 illustrate error rates of sequencing as a function of GC content and homopolymer length according to embodiments of the present disclosure.
Figure 8:
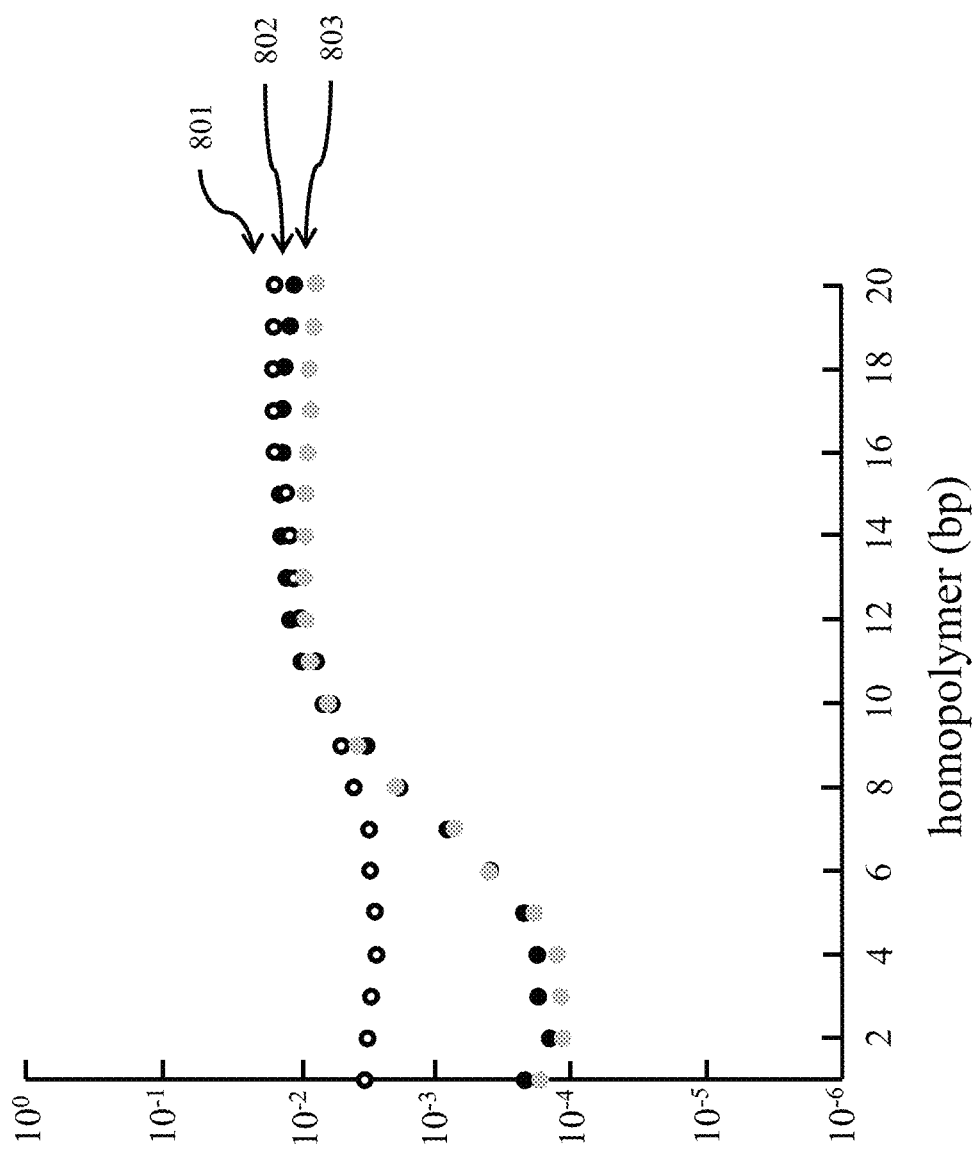

As described herein, polymer storage provides a communication channel. Information is transmitted over the channel by synthesizing oligos. Information is received by sequencing the oligos and decoding the sequencing data. The channel is noisy due to various experimental factors, including polymer synthesis imperfections, PCR dropout, stutter noise, degradation of polymer molecules over time, and sequencing errors. Unlike classical information theoretic channels (e.g., the binary symmetric channel) where the noise is identical and independently distributed, the error pattern in a polymer can be heavily depends on the input sequence. For instance, in the case of DNA storage, homopolymer runs and GC content are major determinants of synthesis and sequencing errors. For example, oligos with a GC content above 60% exhibit high dropout rates and most PCR errors occur in GC rich regions. Once the homopolymer run is more than 4 nt, the insertion and deletion rates start climbing and genomic regions with both high and low GC content are underrepresented in Illumina sequencing (FIGS. 7-8). PCR slippage errors increase rapidly in homopolymers greater than 4 bp. On the other hand, oligos without these characteristics usually exhibit low rates (1%) of synthesis and sequencing errors.

FIGS. 7-8 illustrate error rates of Illumina sequencing as a function of GC content and homopolymer length. Mismatches are indicated at 701, 801. Deletions are indicated at 702, 802. Insertions are indicated at 703, 803.

To facilitate quantitative analysis, the sequence-specific noise can be modeled by grouping DNA oligos into two classes: valid and invalid. A sequence is considered valid if its GC content is within $0.5 \pm c_{gc}$ and its longest homopolymer length is up to m nucleotides. Otherwise, it will be considered invalid and cannot not be transmitted. The coding potential, b, describes the entropy of each nucleotide in valid sequences. Next, valid sequences are exposed to a low $\delta_v$ dropout rate. Due to the multiplexing architecture of synthesis reactions and high throughput sequencing, the oligos are completely mixed in a pool. Therefore, each oligo is indexed with a short tag. The length of the total oligo will be denoted by l and the fraction of nucleotides that are used for the index will be denoted by i and K will denote the number of segments needed for decoding in the input file. By selecting realistic values for m, $c_{gc}$, i, and $\delta_v$, the information capacity can be approximated. Information capacity is defined as the upper bound on the number of bits that can be encoded per nucleotide. This model does not include synthesis and sequencing errors for valid oligos.

It is possible to achieve an error-free consensus for the original oligos by deep sequencing the oligo pool. When deep sequencing coverage is used (250×) using the master pool, an error-less recovery is achievable without implementing the error correcting code but only a k-mer correction strategy (such as Quake, as noted above). In a case of low sequencing coverage, this analysis is likely to provide an upper bound on the capacity of DNA storage.

Key parameters in the channel model for DNA storage are given below in Table 3.

TABLE 3

| Parameter | Meaning | Common Values |
| --- | --- | --- |
| m | Maximal homopolymer length | 3 nt |
| $c_{gc}$ | Maximal deviation of GC content from 0:5 | 0.05-0.2 |
| b | Coding potential [bits] | 1.98 |
| i | Index overhead | 0.05-0.1 |
| l | Oligo length | 100-200 nt |
| $\delta_v$ | Dropout rates | 0-0.005 |

As shown below, the information capacity per nucleotide is approximately 1.83 bits.

Figure 9:
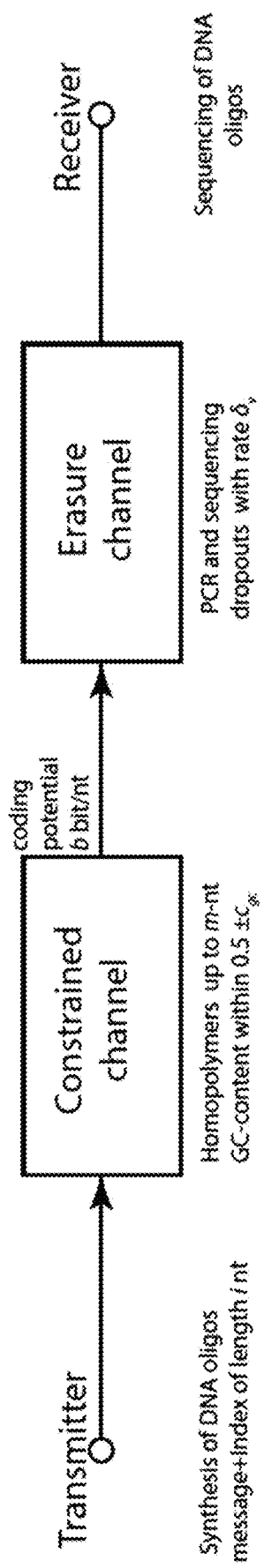
FIG. 9 illustrates a channel model according to embodiments of the present disclosure.

As illustrated in FIG. 9, in various embodiments, a DNA storage device behaves as a constrained channel concatenated to an erasure channel.

Let $A_X$ be the set of all possible transmitted DNA sequences of length l nucleotides, and $A_Y$ be the set of all possible received sequences. X and Y denote random DNA sequences from $A_X$ and $A_Y$, respectively.

The mutual information of X and Y is defined in Equation 1 where H(X) is the entropy (in bits) of X and H(X|Y) is the conditional entropy of X given Y, or the expected residual uncertainty of the receiver about a transmitted sequence.

$$I(X;Y) = H(X) - H(X|Y) \qquad \text{Equation 1}$$

The information capacity of each oligo is defined as in Equation 2 and the information capacity per nucleotide is as in Equation 3.

$$C \equiv \max_{p_X} I(X;Y) \qquad \text{Equation 2}$$

$$C_{nt} \equiv C/l \qquad \text{Equation 3}$$

In a constrained channel, the mutual information is maximized by equiprobable transmission of only valid sequences. Thus, $H(X) = \log_2 |A_X|$, where |•| denotes the size of items in a set. Valid sequences are either perfectly received with a probability of $1-\delta_v$ or dropped out with a probability of $\delta_v$. In the former case, the conditional entropy is H(X|Y)=0, whereas in the latter case the conditional entropy is H(X|Y)=H(X). Therefore, overall, H(X|Y)=$\delta_v$H(X) and the capacity of each nucleotide is given in Equation 4.

$$\begin{aligned} C_{nt} &= \frac{H(X) - H(X|Y)}{l} \\ &= \frac{H(X) - \delta_v H(X)}{l} \\ &= \frac{(1-\delta_v)H(X)}{l} \\ &= \frac{(1-\delta_v)\log_2|A_X|}{l} \end{aligned} \qquad \text{Equation 4}$$

With the homopolymer constraint, the size of the set of all valid code words is given in Equation 5, where $|A_X^h|$ denotes the size of the $A_X$ set under the homopolymer constraint and Q(m, l) is the probability to observe up to an m-nt homopolymer run in a random l-nt sequence.

$$|A_X^h| = Q(m,l) \cdot 4^l \qquad \text{Equation 5}$$

The below explores the simpler case of the probability of not observing a run of m or more successes in l Bernoulli trials with a success probability p and failure probability of q=1−p, denoted by $q_m(p, l)$. A tight approximation for $q_m(p, l)$ may be used as in Equation 6, where x is given in Equation 7 and β is given in Equation 8.

$$q_m(p, l) \approx \frac{\beta}{x^{l+1}} \qquad \text{Equation 6}$$

$$x = 1 + qp^m + (m+1)(qp^m)^2 \qquad \text{Equation 7}$$

$$\beta = \frac{1 - px}{(m+1-mx)q} \qquad \text{Equation 8}$$

The formulae of the probability distribution function for runs of a collection of symbols from a finite alphabet may be defined using recursion or require spectral analysis of matrices with complex patterns and resist analytic analysis. The distribution of observing up to m-nt homopolymer runs may be approximated as the product of four independent events as in Equation 9.

$$Q_{(m,l)} \approx [q_{m+1}(p=0.25,l)]^4 \qquad \text{Equation 9}$$

Table 4 presents the output of Equation 9 versus the expected rate of homopolymer mismatches. Overall the approximation is consistent with the observed rate for relevant oligo lengths and homopolymer constraints.

TABLE 4

| l | m | Obs. $Q_{(m, l)}$ | Est. $Q_{(m, l)}$ |
|---|---|---|---|
| 100 | 3 | 0.31 | 0.31 |
| 250 | 3 | 0.05 | 0.05 |
| 100 | 4 | 0.75 | 0.75 |
| 250 | 4 | 0.48 | 0.48 |
| 100 | 5 | 0.94 | 0.93 |
| 250 | 5 | 0.83 | 0.84 |

Combining Equation 5, Equation 6, and Equation 9 yields Equation 10.

$$\frac{\log_2 |A_X^h|}{l} = \frac{\log_2[4^l \cdot Q(m, l)]}{l} \qquad \text{Equation 10}$$

$$= 2 + \frac{4\log_2\left(\frac{\beta}{x^{l+1}}\right)}{l}$$

$$= (2 - 4\log_2 x) + \frac{4[\log_2 \beta - \log_2 x]}{l}$$

For any m≥3 and l≥50, further approximation is available as in Equation 11.

$$\frac{\log_2 |A_X^h|}{l} = (2 - 4\log_2 x) + \frac{4[\log_2 \beta - \log_2 x]}{l} \qquad \text{Equation 11}$$

$$\approx 2 - 4\log_2 x$$

$$\approx 2 - 4[qp^{m+1} + (m+2)q^2 p^{2m+2}]\log_2 e$$

$$\approx 2 - \frac{3\log_2 e}{4^{m+1}}$$

Figure 10:
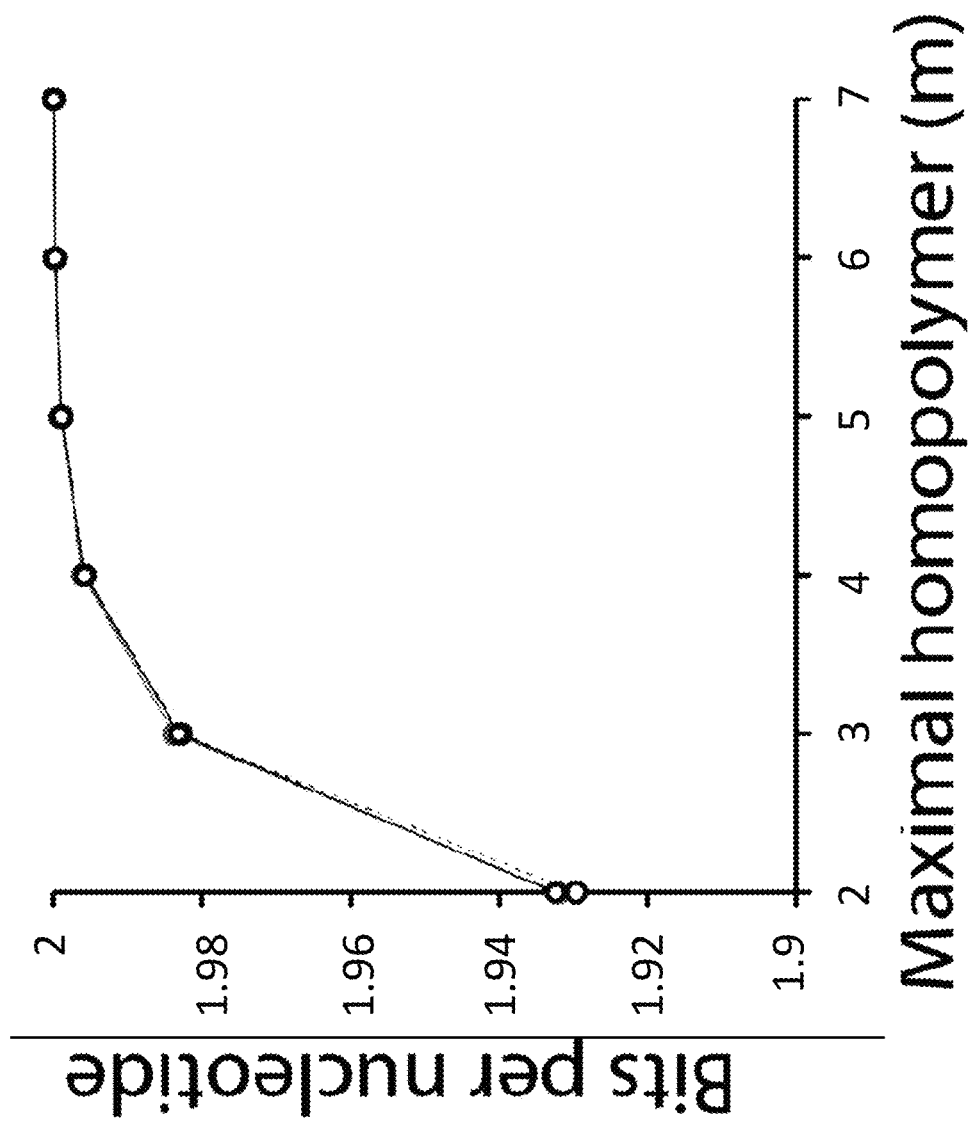
FIG. 10 illustrates the bits per nucleotide according to embodiments of the present disclosure.

The information capacity per nucleotide under the homopolymer constraint does not depend on the length of the DNA oligos, only on only the maximal length of homopolymers, as shown in FIG. 10. In FIG. 10, bits per nucleotide is illustrated as a function of m and l. The black solid line corresponds to l=50 nt. The grey solid line corresponds to l=1011 nt. The broken line approximates the bits per nucleotide using Equation 11. The three curves almost entirely overlap with each other, illustrating the agreement between Equation 10 and the approximation of Equation 11.

Let $p_{gc}$ be the probability that a sequence of l nucleotides is within $0.5 \pm c_{gc}$. Without any other constraint, the $p_{gc}(x)$ is given in Equation 12 where Φ(•) is the cumulative function of a standard normal distribution. The number of bits per nucleotide that can be transmitted under this constraint is given in Equation 13 where $|A_X^{gc}|$ is the size of the $A_X$ set under the GC content constraint.

$$p_{gc} = 2\Phi(2\sqrt{l}\, c_{gc}) - 1 \qquad \text{Equation 12}$$

$$\frac{\log_2 |A_X^{gc}|}{l} = \frac{\log_2[4^l p_{gc}]}{l} \qquad \text{Equation 13}$$

$$= 2 + \frac{\log_2[2\Phi(2\sqrt{l}\, c_{gc}) - 1]}{l}$$

Figure 11:
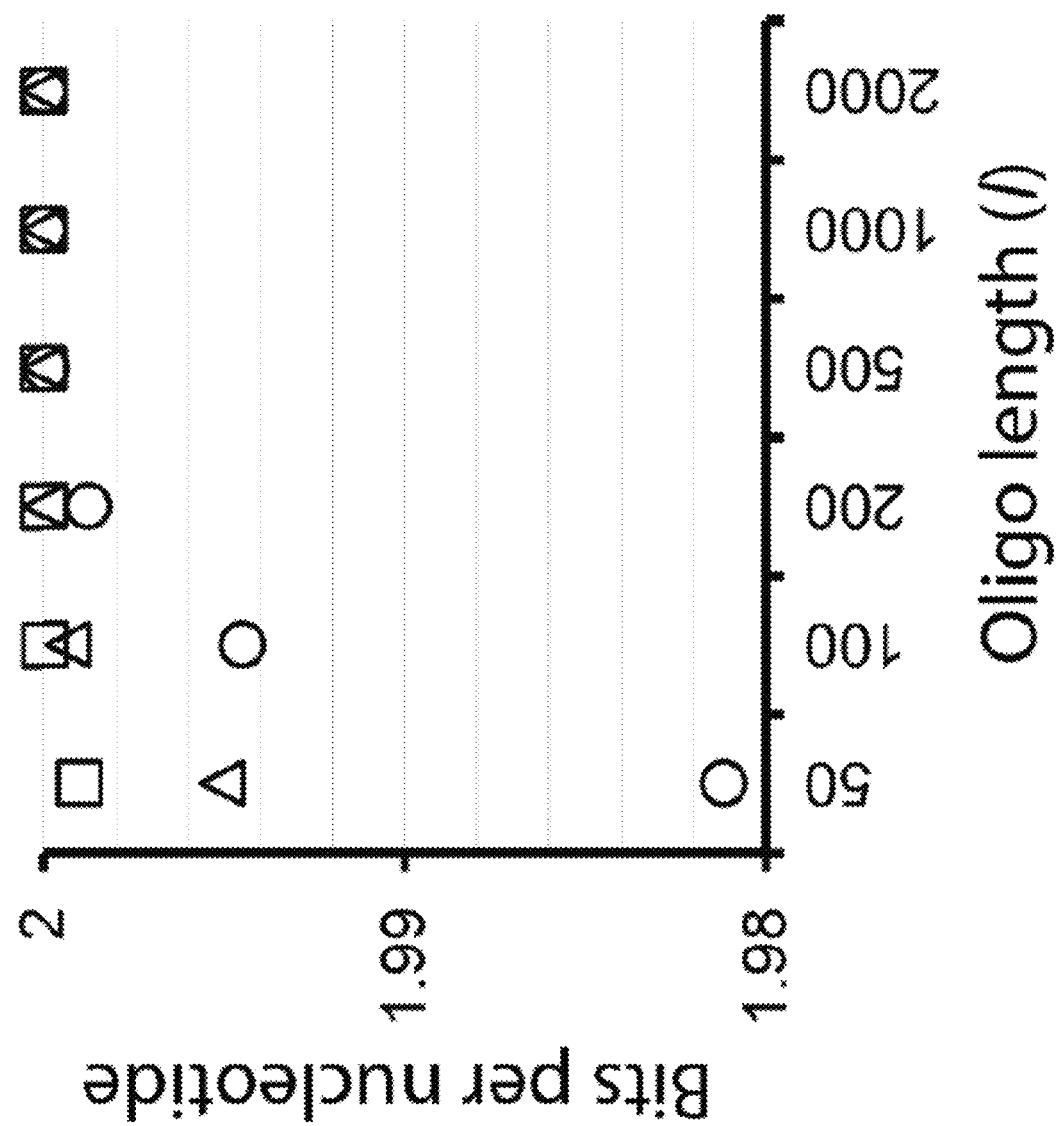
FIG. 11 illustrates channel capacity as a function of oligo length according to embodiments of the present disclosure.

For any reasonable allowable range of GC content such as $c_{gc} \geq 0.05$ and minimal oligo length of l≥50, the GC constraint plays a negligible role in reducing the information content of each nucleotide. For example, with $c_{gc}=0.05$ and l=100 bp, the information content of each nucleotide is 1.992 bits, only 0.4% from the theoretical maximum. FIG. 11 presents the channel capacity as a function of the oligo length under various levels of GC content constraints. Circles, triangles, and squares denote $c_{gc}=(0.05, 0.1, 0.15)$, respectively.

The homopolymer constraint and the GC content constraint define the output of the constrained channel and b, the coding potential per nucleotide as in Equation 14.

$$b = \frac{\log_2 |A_X|}{l} \qquad \text{Equation 14}$$

$$= \frac{\log_2 |A_X^h \cap A_X^{gc}|}{l}$$

$$\approx 2 - \frac{3\log_2 e}{4^{m+1}} - \frac{\log_2[2\Phi(2\sqrt{l}\, c_{gc}) - 1]}{l}$$

To estimate b, a conservative yet practical set of constraints is selected with $c_{gc}=0.05$ and m=3, and an oligo length of l=150 nt. In this example, m=3. For the GC content, a conservative value of $c_{gc}=0.05$ is adopted, which constraint minimally impacts the results. l=150 to match the experiments described herein, and closely corresponds to the maximal oligo lengths of major manufacturers before adding two 20 nt annealing sites for PCR primers. In this setting, the coding potential is given by Equation 15.

$$b = 2 - 0.017 - 0.003 = 1.98 \text{ bits/nt} \qquad \text{Equation 15}$$

$$\downarrow$$

$$m=3$$
$$c_{gc}=0.05$$
$$l=1.50$$

Each oligo should be indexed since they are not received in any particular order. This requirement means that some of the nucleotides in the oligo cannot be used for encoding DNA information. Let l' denote the remaining nucleotides available for encoding data in Equation 16.

$$l' = l - \lceil \log_{2^b} K \rceil$$
$$= l - \left\lceil \frac{\log_2 K}{b} \right\rceil$$

Equation 16

The information capacity of each nucleotide after adding the index is reduced to Equation 17.

$$bl'/l \approx b - \frac{\log_2 K}{l}$$

Equation 17

When the oligo length is fixed, the information capacity goes to zero when the input file becomes larger since indexing would eventually occupy all real estate available on the oligo. However, this issue can be solved by first splitting the file into large blocks of information and encoding each block using a distinct oligo pool that is physically isolated from the other pools, similar to physical hard-drives in an external storage device. For example, a DNA storage architecture may be provided that consists of an array of 16 Tbytes per oligo pool (comparable to the largest single hard-drive available today). With 150 nt oligos, indexing would take only 20 nt. This translates to a 13% reduction of the effective oligo length, meaning an information capacity of 1.77 bits/nt. In another architecture of an array of oligo pools of 1 Mbyte to 1 Gbyte of data, the indexing cost goes down to 8 to 13 nucleotides, respectively. This translates to approximately 7% reduction in the coding capacity to $C_{nt}$=1.84 bits/nt assuming no dropouts.

The probability of oligo dropouts on the channel capacity should also be considered. Sequencing coverage follows a negative binomial distribution (NB) with average of μ and a size parameter r. The average coverage μ is largely determined by the capacity of the sequencer, whereas r corresponds to the library preparation technology. When r goes to infinity, then the distribution behaves as Poisson. In practice, however, r is usually between 2 and 7. For example, r=2 in an exome sequencing dataset and r=4 for whole genome sequencing using Illumina. In the present examples, a value of r=6.4 is observed for the master pool that used a relatively small number of PCR rounds and r=1.3 for the deep copy that underwent 90 PCR cycles. The overdispresion is defined as 1/r, because it it more intuitive to understand that larger values are more overdispresed.

To find the expected rate of dropouts, the probability of getting zero sequencing coverage is evaluated. Let P (x; μ, r) be the probability mass function of a negative binomial distribution. In general this is given by Equation 18 where p=r/(r+μ). Then, the rate of dropouts is as in Equation 19.

$$P(x; \mu, r) = \binom{x + r - 1}{x}(1 - p)^r p^x$$

Equation 18

$$\delta_v = P(x = 0; \mu, r) = \left(\frac{\mu}{\mu + r}\right)^r$$

Equation 19

Figure 12:
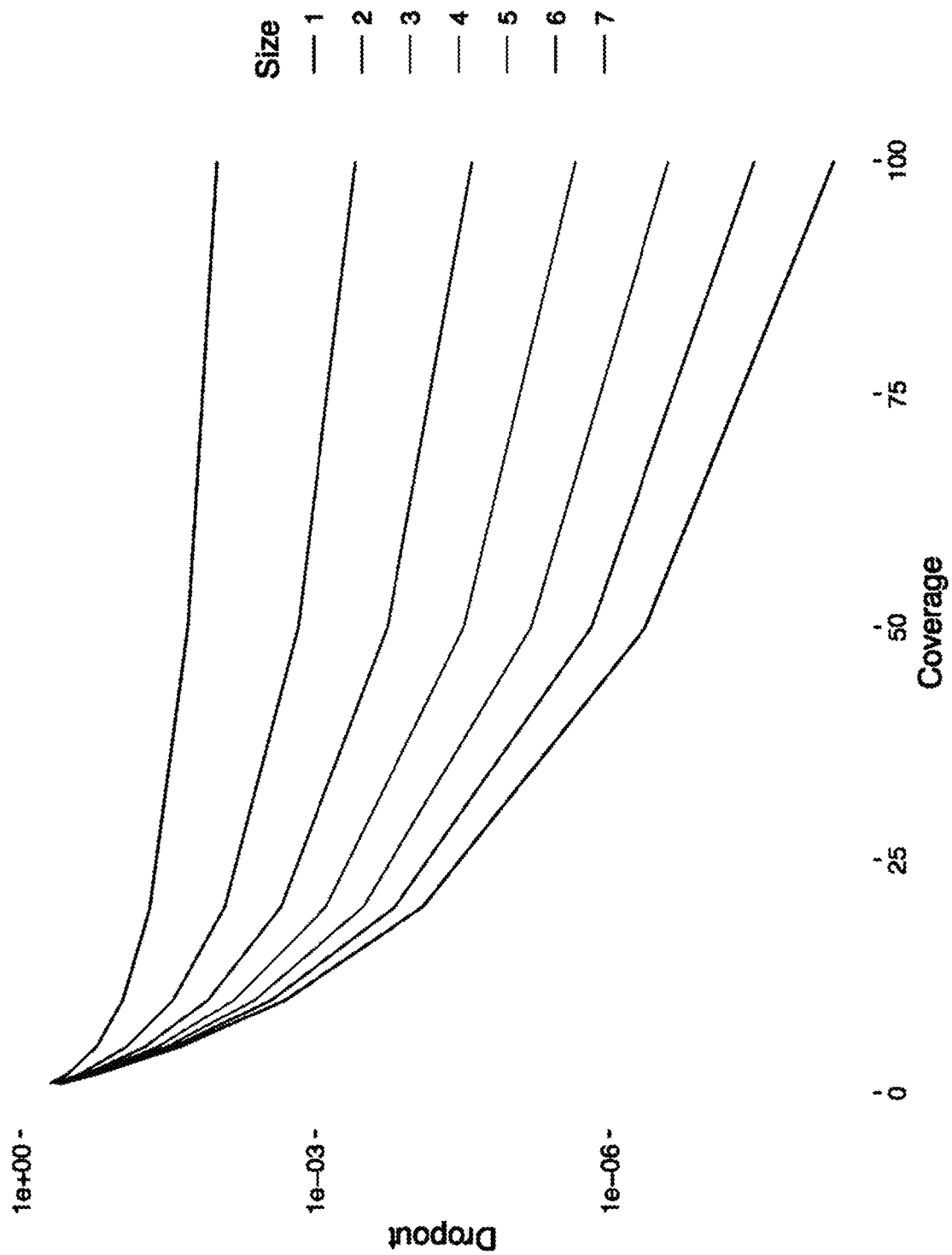
FIG. 12 illustrates dropout rate as a function of average sequencing coverage according to embodiments of the present disclosure.

There is agreement between the model and the empirical number of dropouts. For example, in various downsampling experiments, the average coverage per oligo is reduced to μ=5.86 (the size parameter is invariant to downsampling and stayed at r=6.4). Equation 19 predicted a dropout rate of 1.5%, whereas the observed rate of missing oligos was $\delta_v$=1.3%. FIG. 12 shows the expected dropout rates for a range of average sequencing coverage and as a function of the size parameter for the relevant range of oligo experiments.

These results show that for a reasonable sequencing coverage of μ=10 and a relatively mediocre size parameter of r=2, the expected dropout rate is 2.7%. When the size parameter is better with r=6, the dropout rate is approximately 0.25%. In many storage architectures, the dropout rates should be around δ=0.5%. When the size parameter is excellent (r=7), this dropout rate can be achieved with a low coverage of μ=7. When the size parameter is of low quality (r=1.5), one can achieve this rate with sequencing coverage μ=50, which is not unreasonable even for large oligo pools.

According to Equation 3 the reduction in capacity per nucleotide is proportional to the dropout rate. As set out above, the capacity is $C_{nt}$=1.84 bits/nt without any dropout. With a dropout rate of 0.5%, the capacity is $C_{nt}$=1.83 bits/nucleotide.

As described herein a scheme is provided that screens potential oligos to realize the maximal coding capacity with b=1.98 bit/nt. The seed has 4 bytes that can encode files of up to 500 MByte. A 2 byte Reed-Solomon error correcting code is included in some embodiments that protects both the seed and the data payload. The level of redundancy against dropouts may be determined by the user, and in some embodiments is a level of 1.07× because of the proposed cost from the oligo manufacturer. In one example. 2,146,816 bytes of information are encided using 72,000 oligos of length 152 nt. The net information density is thus 2146816× 8/(72000×152)=1.57 bits per nucleotide.

Some differences in the net information densities between schemes can be attributed to different oligo lengths or indexes. The net density is presented without standardizing the schemes to a specific oligo/index length for several reasons: first, certain alternative schemes employ error correcting codes that are designated for specific input and output lengths. It is not easy to translate the scheme to a different oligo length without completely changing their error correcting strategy. Second, imputing the net density for a different architecture without empirical tests can be misleading. For example, alternative schemes that allow filtering of sequencing errors even with low sequencing coverage using a single parity nucleotide when the length of oligos is 117 nt, can not be readily generalized to work with 150 nt oligos that are more error prone. Third, the standardization does not significantly affect the overall picture. For example, after standardizing various alternative schemes to have an index length of 28 bits and oligo length of 152 nt, the net density goes from 0.83 bit/nt to 0.81 bit/nt. In another example, net density goes from 0.34 bit/nt to 0.28 bit/nt after standardization.

SI units are used throughout the present disclosure to indicate the scale of digital information rather than the Joint Electron Device Engineering Council (JEDEC) standard. Thus, 1 Mbyte refers to $10^6$ bytes and not $2^{20}$ bytes, 1 Pbyte refer to $10^{15}$ bytes and not $2^{50}$ bytes.

The physical densities given herein are calculated including the adapter regions.

Encoding algorithms according to various embodiments of the present disclosure include three computational steps: (a) preprocessing, (b) Luby Transform, and (c) screening. In combination, such algorithms convert input files into a collection of valid DNA oligos that pass the biochemical constraints and are sent to synthesis. It will be appreciated that although various embodiments are described with relation to the Luby Transform, alternative optimal or near-optimal fountain codes may be applied in accordance with the present disclosure. Likewise, it will be appreciated that certain other optimal or near-optimal erasure codes are suitable for use in accordance with the present disclosure.

In the preprocessing step according to various embodiments, the files of interest are packaged into a single tape-archive (tar) file, which is then compressed using a standard lossless algorithm (e.g., gzip). Compression reduces the size of the tar file and increases the entropy of each bit of the input file and reduces local correlations, which is advantageous for the screening step. The compressed file is logically partitioned into non-overlapping segments of length L bits, which is a user defined parameter. In various embodiments, L=256 bits (32 bytes), since this number is compatible with standard computing environments and generates oligos of lengths that are within the limit of the manufacturer.

To apply the Luby Transform, a pseudorandom number generator (PRNG) is initialized with a seed, which may be selected by various methods, including those set forth above.

The number of segments to package in the droplet, d, is selected. In some embodiments, the algorithm uses the PRNG to draw a random number from a special distribution function, called robust solution probability distribution. The robust solution distribution function is bi-modal and ensures that most of the droplets are created with either a small number of input segments or a fixed intermediary number of segments. This mathematical property is advantageous for the decoding process.

The algorithm again uses the PRNG to draw d segments without replacement from the collection of segments using a uniform distribution.

The algorithm performs a bitwise-XOR operation (bitwise addition modulo 2) on the segments. For example, consider that the algorithm randomly selected three input fragments: 0100, 1100, 1001. In this case, the droplet is: 0100⊕1100⊕1001=0001.

The algorithm attaches a fixed-length index that specifies the binary representation of the seed. For example, if the seed is 3 and the fixed index length is 2 bits, the output droplet will be 110001. In some embodiments, a 32 bit (4 byte) index is used for compatibility with standard computing environments.

A error correcting code computed on the entire droplet may be applied in some embodiments. For example, two bytes of Reed-Solomon may be added over GF(256) to increase the robustness of the design.

The Luby Transform confers robustness against dropouts. The transform additions can be thought of as representing the input segments as a binary system of linear equations. Each droplet is one equation, where the seed region has one to one correspondence to the 0-1 coefficients of the equation, the payload region is the observation, and the data in the input segments are the unknown variables of the system. To successfully restore the file, the decoder needs to solve the linear system. This task can be done (with a very high probability) by observing any subset of a little more than K droplets. Encoder provided herein exploit this property to create robustness against dropouts. More oligos are produced than the dropout rates (e.g., 5% more oligos) to create an over-determined system. Then, no matter which oligos are dropped, the system is solvable to recover the file as long as more than K are collected.

In the screening step, the algorithm excludes droplets that violate the required biochemical constraints from the DNA sequence. First, it converts the droplet into a DNA sequence by translating {00,01,10,11} to {A,C,G,T}, respectively. For example, the droplet "110001" corresponds to "TAC". Next, the algorithm screens the sequence for desired properties such as GC content and homopolymer runs. If the sequence passes the screen, it is considered valid and added to the oligo design file. Otherwise, the algorithm discards the sequence. Since the compressed input file behaves as a random sequence of bits, screening has no effect on the distribution of the number of source fragments in the valid droplets. For example, a droplet that was created by XOR-ing 10 source fragments has the same chance of passing the screen as a droplet with only 1 source fragment. This asserts that the number of droplets in a valid oligo follows the robust solution distribution regardless of the screening, which is advantageous for the decoder.

Oligo creation and screening is continued until a desired number of oligos are produced. In some embodiments, the decoder outputs a FASTA file that can be sent to the oligo manufacturer.

The process of droplet creation starts with a seed to initialize the pseudorandom number generator. A fountain code implementation may start with a specific seed that is incremented with every round. For present purposes, an incremental seed schedule creates bursts of invalid sequences. For example, any seed in interval [0, 1, . . . , 16777215] would be mapped to a sequence that starts with an AAAA homopolymer when representing the seed as a 32 bit number.

Accordingly, a strategy is desirable that would go over each number in the interval [1, . . . , 232-1] in a random order to avoid bursts of invalid seeds. One such suitable strategy is a Galois linear-feedback shift register (LFSR). In such approaches, a predetermined seed (e.g., 42) is represented as a binary number in the LFSR. Then, one round of the LFSR is applied, which shifts and performs a XOR operation on specific input bits within the register. This operation corresponds to a polynomial multiplication over a finite field. The new number in the register is used as the seed for the next droplet. By repeating this procedure, a sequence of seeds is generated in a pseudo-random order. To scan all numbers in the interval, the LFSR is configured to use the primitive polynomial $x^{32}+x^{30}+x^{26}+x^{25}+1$ for the multiplication of the number in the register. With this polynomial, the LFSR is guaranteed to examine each seed in the interval [1, . . . , 232-1] without repetition. In other embodiments, a different seed space may be applied. This can be done by switching the polynomial in the LFSR. Various LFSR polynomials are known with a cycle of 2n-1 for a wide range of n.

The robust solution distribution function, $\mu_{K,c,\delta}(d)$ is a component of the Luby Transform. Two probability distribution functions, $\rho(d)$ and $\tau(d)$, may provide the building blocks for the robust solution distribution function. However, it will be appreciated that a variety of distributions may be used in accordance with the present disclosure.

Let $\rho(d)$ be a probability distribution function as in Equation 20.

$$\rho(d) \equiv \begin{cases} 1/K & \text{if } d = 1, \\ \dfrac{1}{d(d-1)} & \text{for } d = 2, \ldots, K. \end{cases} \quad \text{Equation 20}$$

Let τ be a probability distribution function as in Equation 21 where $s \equiv \sqrt{K} \ln^2(K/\delta)$.

$$\tau(d) \equiv \begin{cases} \dfrac{s}{Kd} & \text{for } d = 1, \ldots, (K/s) - 1 \\ \dfrac{s \ln(s/\delta)}{K} & \text{for } K/s \\ 0 & \text{for } d > K/s \end{cases} \quad \text{Equation 21}$$

The robust solution distribution is defined as in Equation 22 Where Z is a normalization parameter, $Z \equiv \Sigma_d \rho(d) + \tau(d) = 1$.

$$\mu_{K,c,\delta}(d) \equiv \frac{\rho(d) + \tau(d)}{Z} \quad \text{Equation 22}$$

Figure 14:
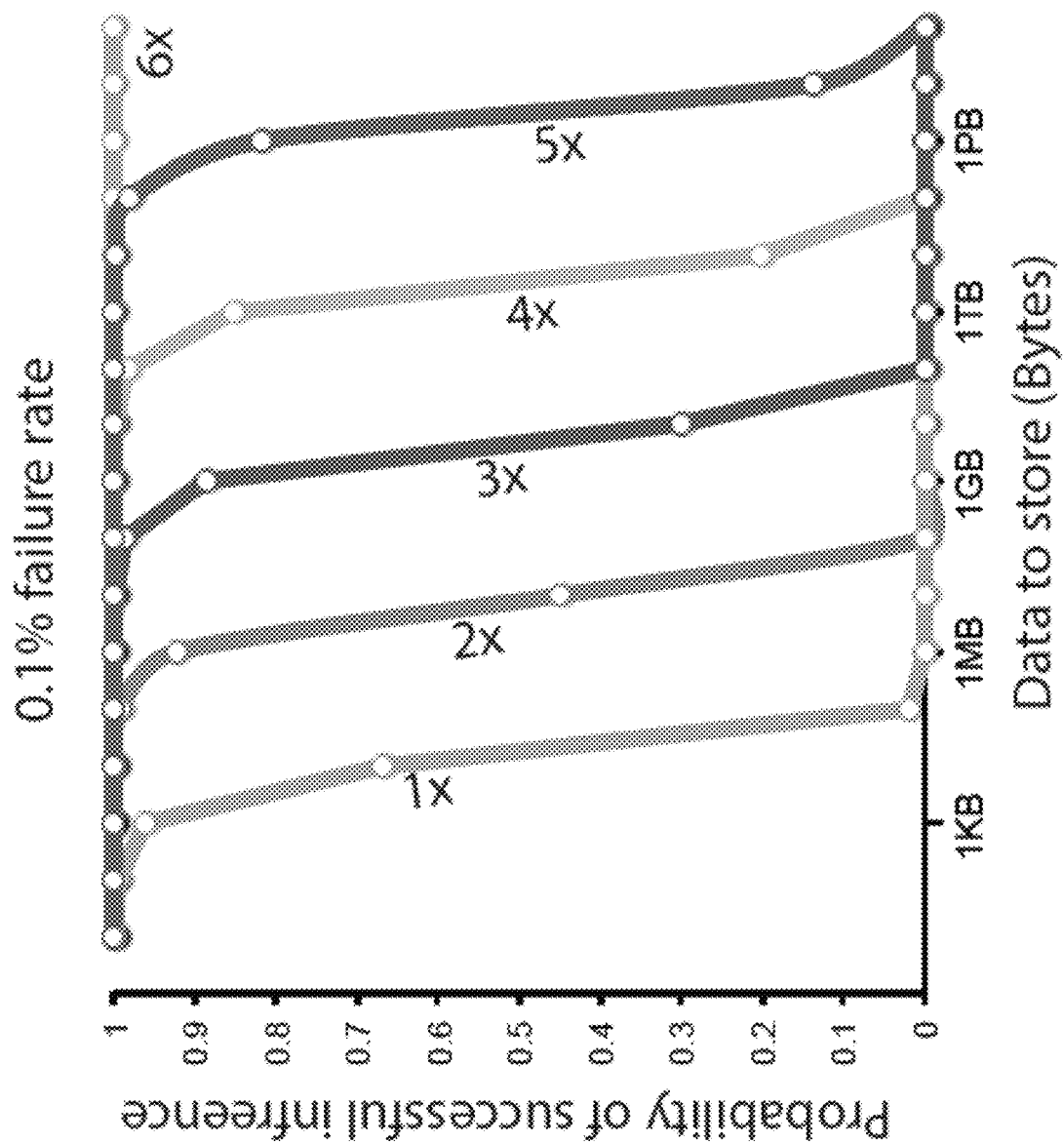

FIGS. 13-14 illustrate the probability of perfect retrieval (no gaps) of information as a function of input size and the number of times each input bit is repeated on distinct oligos. FIG. 13 corresponds to a dropout rate of 2%. FIG. 14 corresponds to a dropout rate of 0.1%. With this low dropout rate, 1 Gbyte storage has a 10% chance of data corruption even when each bit is stored on 3 distinct oligos.

Figure 15:
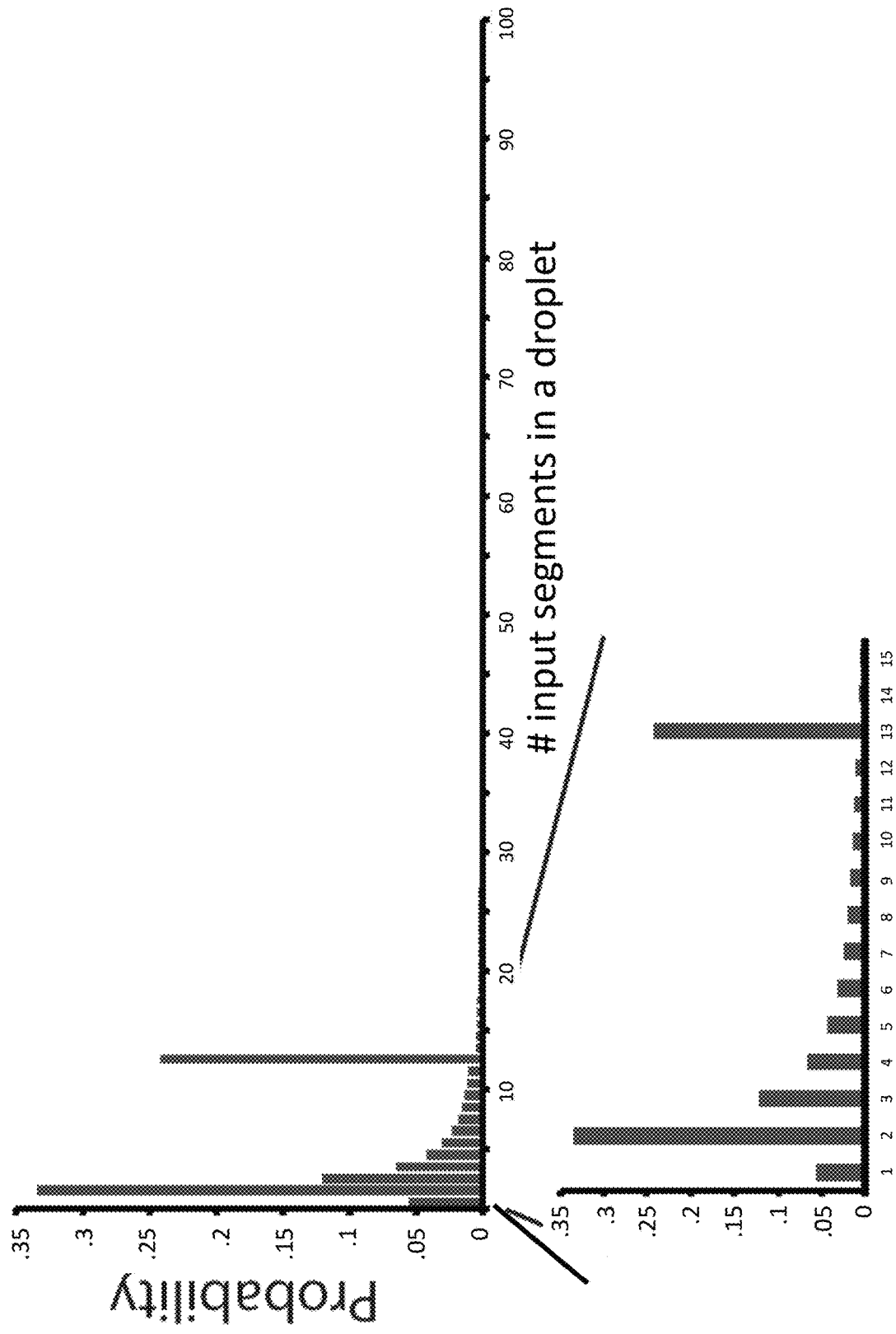
FIG. 15 illustrates an exemplary solution distribution according to embodiments of the present disclosure.

FIG. 15 presents an example of the robust solution distribution with (K=100, c=0.1, δ=0.05). Most droplets will include 1-3 input segments and a large fraction of the remainder will include 13 segments. The c and δ parameters may be controlled by the user.

The two free parameters, c and δ, may be specified by the user during the oligo synthesis stage. In general, δ is the upper bound probability of failing to recover the original file after receiving K·Z droplets. This upper bound is highly pessimistic and the probability of a failure is much smaller in practice. The c parameter is a positive number that affects the decoding/encoding performance. On one hand, low values of c reduce the average number of oligos that are required for successful decoding. On the other hand, low values of c increase the variance around the average. In addition, low values of c increase the average number of segments in each droplet. This translates to deeper recursions of the decoding algorithm and increases the runtime.

In the present examples, δ=0.001 and c=0.025. With these values, Z=1.033, meaning that at least 3% more oligos than the number of segments are generated.

In some embodiments, to decode the data, preprocessing is first performed. The paired-end reads are stitched using PEAR and only sequences whose length was 152 nt are retained. Next, identical sequences are collapsed, and the collapsed sequence and its number of occurrences in the data are stored. The sequences are sorted based on their abundance so that more prevalent sequences appear first. This way the decoder observes the highest quality data first and gradually gets sequences with reduced quality. Due to the redundancy of this approach, the decoder usually does not need all oligos to construct the original file and will usually stop before attempting to decode sequences that were observed a small number of times (e.g., singletons), that are more likely to be erroneous.

From this point the decoder process works sequentially and executes droplet recovery and segment inference on each collapsed sequence until the file is fully resolved.

In droplet recovery according to the present disclosure, the decoder maps the DNA sequence into a binary format by translating {A,C,G,T}, to {0, 1, 2, 3}. Next, it parses the sequence read to extract the seed, data payload, and the error correcting code (if any). If there is an error correcting code, the decoder checks whether there are any errors. In some embodiments, sequences with an indication of one or more errors are excluded and correction is not attempted. Most errors are due to short insertions and deletions, potentially from the oligo synthesis. Reed-Solomon error correcting code can only handle substitutions and attempting to correct the sequence is more likely to result in erroneous recovery. In addition, the user can instruct the decoder also for an additional error detection approach using k-mers. Under this option, the decoder will first compare a new sequence read to all previously processed reads that were used for decoding. If there is at least one match of a stretch of k nucleotides than the new sequence would be discarded. Erroneous reads should show a high but not perfect similarity to valid oligos that were observed before.

In segment inference according to various embodiments, after validating the integrity of the binary message, the decoder initializes a pseudorandom number generator with the observed seed. This generates a list of input segment identifiers. Next, it employs one round of a message passing algorithm, which works as follows. First, if the droplet contains segments that were already inferred, the algorithm will XOR these segments from the droplet and remove them from the identity list of the droplet. Second, if the droplet has only one segment left in the list, the algorithm will set the segment to the droplet's data payload. Next, the algorithm will propagate the information about the new inferred segment to all previous droplets and will repeat the same procedure recursively, until no more updates can be made. If the file is not recovered, the decoder will move to the next sequence in the file and execute the droplet recovery and segment inference steps. This process of propagation of information eventually escalates that solves the entire file as shown in FIG. 17.

Figure 17:
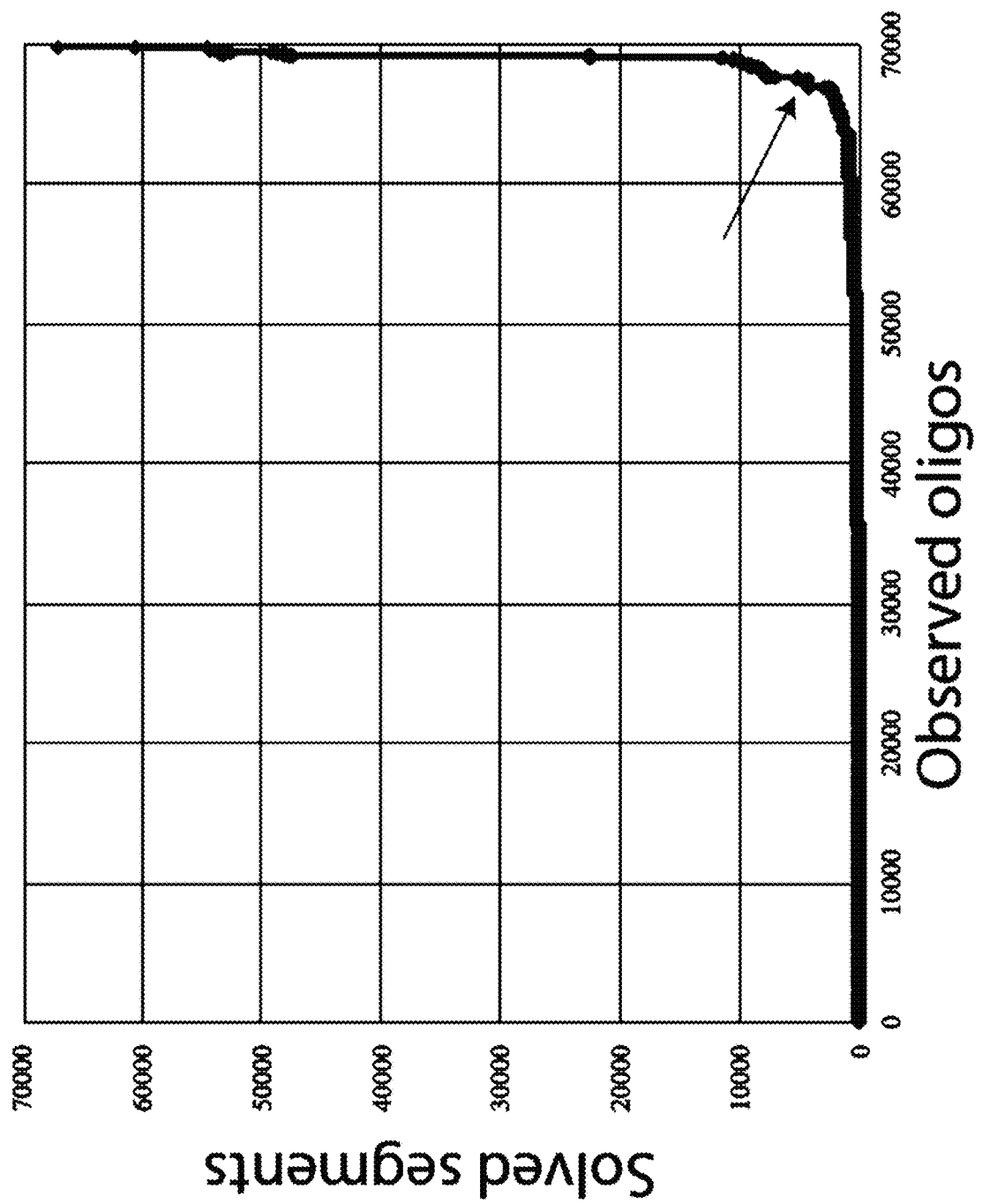
FIG. 17 illustrates the number of solved segments as a function of observed oligos according to embodiments of the present disclosure.

FIG. 17 illustrates the number of solved segments as a function of observed oligos. The figure demonstrates the avalanche process. At first, the observed oligos cannot determine the data in the input segments. When the number of observed oligos is about the same as the number of input segments (green arrow), sufficient information has accumulated to infer the data in the input segments and an avalanche of inference starts with each new oligo. Notice that the decoder needed only to observe 69,800 oligos out of the 72,000 synthesized oligos to decode the entire file, illustrating the robustness against dropouts.

Various embodiments approach the channel capacity but still entail a small overhead for a wide range of realistic applications. First, even with zero probability of dropout, more oligos need to be synthesized than the number of input segments. As discussed above, the robust solution distribution asserts convergence of the decoder (with a probability of δ) when K·Z droplets are seen. In general, when K is extremely large, Z 1, meaning that the code is rateless and entails no overhead. However, for experiments with tens of thousands of oligos, Z is on the order of 3% and empirical results with 10,000 segments have observed on average a 5% overhead for successful decoding. Second, this strategy entails a small inflation in the size of the index. Equation 16 shows that the minimal index length is $\log_2{}^b K = \log_{3.95} K$. In this case, the index space must be larger to accommodate both successful and failed attempts to construct a droplet. This inflation is modest and only scales logarithmically with the size of the search space. For example, when screening 150 nt oligos for a GC content between 45% and 55% and homopolymer runs of up to 3 nt, only 12.5% of the oligos pass these conditions. This requires the index to have an additional $\lceil\log_{3.95}(1/0.125)\rceil=2$ nucleotides, which reduces the information content by 2/150=1.3% from the theoretical maximum. Thus, this approach could theoretically reach 100%−(3%+1.3%)≈96% of the channel capacity for examples with tens of thousands of oligos.

In various examples above, 57/1.83=86% of the channel capacity is realized. The difference between the practical code rate and the theoretical rate is explained by three factors. First, the coding strategy included a redundancy level of 7%, about 3% more than the required overhead for successful decoding with 0.5% dropout rate. As explained above, this level is used in various examples primarily due to the price structure of the oligo manufacturer that offered the same price for any number of oligos between 66,000 to 72,000. The flexibility of the methods described herein to maximize the number of informative oligos within a specific price range in an advantage of these techniques. For the seed space, 32 bits is used. This seed is about 9 bits over what is needed for encoding all successful and failed attempts to create valid oligos for a file of size 2.1 Mbyte. This length is used in various examples in order to be able to scale the same architecture to store files of 500 Mbyte. Finally, an error correcting code of two bytes is included in each oligo, which reduces the rate by another 5%.

The above examples show that methods according to the present disclosure are suitable for a range of file sizes and oligo lengths. From a computational complexity perspective, encoding strategies scale log-linearly with the input file size and empirical tests show that a 50 Mbyte file takes about 1 hour on a single CPU of a standard laptop. The complexity scales exponentially with the oligo length because it becomes harder to find sequences without homopolymers and increasing numbers of droplets are created only to be destroyed in the screening process. However, the base of the exponent is very close to 1. For example, with m=3, the complexity scales with $O(1.01^l)$ and with m=4 the complexity scales with $O(1.003^l)$. With this low exponent we found that our strategy is still practical for a range of oligo lengths even above the limit of major oligo pool manufacturers of approximately 200-250 nt. For example, encoding data on 300 nt oligos takes only 3 min for 1 Mbyte per CPU and encoding 400 nt oligos takes 6 min for the same conditions as illustrated in Table 5.

TABLE 5

|  | Condition | Run time[sec] | Computing costs [cents] | saved [$] |
|---|---|---|---|---|
| Input file | 1 Mbyte | 50 | 0.02 | 5,000 |
|  | 2 Mbyte | 112 | 0.04 | 11,000 |
|  | 4 Mbyte | 200 | 0.07 | 23,000 |
|  | 8 Mbyte | 436 | 0.15 | 45,000 |
|  | 16 Mbyte | 897 | 0.31 | 96,000 |
|  | 32 Mbyte | 1817 | 0.63 | 192,000 |
|  | 64 Mbyte | 3699 | 1.28 | 377,000 |
| Oligo length | 100 nt | 53 | 0.02 |  |
|  | 152 nt | 40 | 0.01 |  |
|  | 200 nt | 54 | 0.02 |  |
|  | 252 nt | 84 | 0.03 | 5,000 |
|  | 300 nt | 137 | 0.05 |  |
|  | 352 nt | 222 | 0.07 |  |
|  | 400 nt | 374 | 0.13 |  |

Table 5 illustrates the encoding time and cost saving using methods according to the present disclosure. Run time indicates the empirical time it takes the encoder to convert an input file to oligos for one CPU. Computing costs show an estimate of the price to encode the file using Amazon Cloud with a price of $0.5 per hour for a 40 CPU server. Oligo synthesis money saved reports the estimated difference in budget between these techniques and previous techniques with an information capacity of approximately 0.9 bit/nt. A constant price is assumed for different oligo lengths and sizes of $640 per 1 Mbase. Saving was rounded to the closet thousand. The upper part of the table reports the results for different input file sizes and an oligo length of 152 nt. The bottom part reports the results for different oligo lengths and a 1 Mbyte input file.

The ability to include more information in each nucleotide compensates for the computation price even for long oligos. For example, encoding 1 Gbyte of information on 400 nt oligos would take 4 CPU days. The encoder may be parallelized on multiple CPUs by letting each encoder thread scan a different region in the seed space. With the current price of $0.5 for one hour of a 40 CPU server on Amazon Web Services, the entire input data can be encoded for $1.25 in a few hours. The price of the computing time is substantially smaller than the cost reduction in the oligo synthesis costs.

With respect to the decoder, the time complexity is O(K log K) as in Luby Transform. The decoding complexity may be reduced to O(K) by using Raptor codes on top of the Luby Transform.

In an exemplary test, encoding and decoding as described above were done using a MacBook Air with a 2.2 GHz Intel Core i7 and 8 Gbyte of memory. The code was tested with Python 2.7.10.

The oligo pool was synthesized by Twist Bioscience. The lyophilized pool consisted of 72,000 oligos of 200 nt, which included the 152 nt payload flanked by landing sites for sequencing primers:

(SEQ ID NO: 2)
GTTCAGAGTTCTACAGTCCGACGATC[N152]TGGAATTCTCGGGTGCCA

AGG

The pool was resuspended in 20 uL TE for a final concentration of 150 ng/ul. PCR was performed using Q5 Hot Start High-Fidelity 2× Master Mix (NEB # M0494) and Illumina small RNA primers RP1 and RPI1 (100 ng oligos, 2.5 ul of each primer (10 µM), 25 ul Q5 Master Mix in a 50 ul reaction).

PCR Primer (RP1):

(SEQ ID NO: 3)
5' AATGATACGGCGACCACCGAGATCTACACGTTCAGAGTTCTACAGTC

CGA

PCR Primer, Index 1 (RPI1):

(SEQ ID NO: 4)
5' CAAGCAGAAGACGGCATACGAGATCGTGATGTGACTGGAGTTCCTTG

GCACCCGAGAATTCCA

Thermocycling conditions were as follows: 30 s at 98 C; 10 cycles of: 10 s at 98 C, 30 s at 60 C, 30 s at 72 C, followed by a 5 min. extension at 72 C. The library was then purified in a 1:1 Agencourt AMPure XP (Beckman Coulter # A63880) bead cleanup and eluted in 20 ul water. This library was considered the master pool. Running the library on a BioAnalyzer showed an average size of 263 nt (as illustrated in FIG. 16), close to the expected 265 nt expected by the oligo length (152 nt before annealing sites) and the two PCR adapters of length 50 nt and 63 nt. FIG. 16 illustrates BioAnalyzer results for the oligo pool. The average fragment size was 263 nt, concordant with an oligo length of 200 nt and the two PCR adapters.

The oligo pool was sequenced using on a single flow cell of the Miseq v3 kit (Illumina # MS-102-3001) at the New York Genome Center using a 150 pair-end read protocol. Raw .bcl files were downloaded from BaseSpace and analyzed.

For the nine consecutive PCR reactions, we started with the master pool as described above. Then, 9 subsequent rounds of PCR were performed using the same conditions as above. The first round used 10 ng of oligo input from the master pool into 25 ul PCR reactions. Then, 1 ul from each PCR reaction was input into each subsequent round of PCR for a total of 9 reactions without cleanup. The final round was purified in a 1:1 Agencourt AMPure XP bead cleanup and eluted in 20 ul deionized water. The final library was run under the same conditions as described.

This procedure can theoretically create $300 \times 25^9 \times 2 = 2.28 \times 10^{15}$ copies of the file (see FIG. 18). The decoding procedure for this library is identical to the one presented for the master copy. Fitting the negative bionomial distribution was done in R using the fitdistr command.

FIG. 18 illustrates the exponential amplification process. Each PCR reaction generates enough volume for multiple subsequent reactions. The first PCR reaction used only 10 ng from the master pool of 3 ug of DNA. This implies that 300 similar reactions can be conducted using the master pool. Each subsequent PCR used 1 ul out of 25 ul generated by the previous reaction. Therefore, an exponential process could amplify the number of copies by 25 times in each reaction (gray tubes). Eventually, about half of the final reaction is consumed for sequencing and QC, meaning that the final reaction can be sequenced twice. In total, the nine step amplification process has the potential to create $300 \times 25^9 \times 2 = 2.28$ quadrillion copies.

The Church et al. prediction regarding theoretical density of DNA storage was derived from their main text (5.5 petabit/mm3) and using their estimated mass density of DNA of 1 mg/1 mm$^3$.

To generate a serial dilution of the library, we started with the original library generated by Twist. The concentration of this library was determined by Nanodrop single-strand DNA measure and was found to be 150 ng/ul. To generate condition 1, 2 ul of DNA is obtained from this library into 28 of TE buffer. Measuring condition 1 using Nanodrop confirmed that the concentration was 10 ng/ul. Next, the library is diluted by a factor of ×10 by taking 4 ul of the previous condition into 36 ul of TE and repeating this procedure 6 more times to generate libraries in concentrations of 10 ng, 1 ng, 100 pg, 10 pg, 1 pg, 100 fg, and 10 fg. 1 ul of each library is then taken to a PCR reaction of 50 ul and the reaction is run for 40 cycles. Each library is barcoded with a distinct 6 nt barcode to allow multiplexing. The libraries are then loaded using the Illumina standard protocol and the libraries are sequenced using two lanes of the Rapid Sequencing kit to 150 pair-end reads.

The number of molecules per oligo for each dilution was determined according to: $w_i[g]/(200[nt] \times 325[Dalton/nt] \times 1.67 \times 10^{-24}[g/Dalton] \times 72000[oligos])$, where $w_i$ is the total weight of DNA in the library (e.g., 10 ng, 1 ng, . . . ).

To test this case, all sequence reads that passed assembly were scanned regardless of their length. Next, if a unique match was found of at least 15 nt to one of the 72000 oligos, the read was replaced with the original oligo. Finally, the number of unique oligos was counted. In all cases, enough unique oligos were available for decoding.

Figure 19:
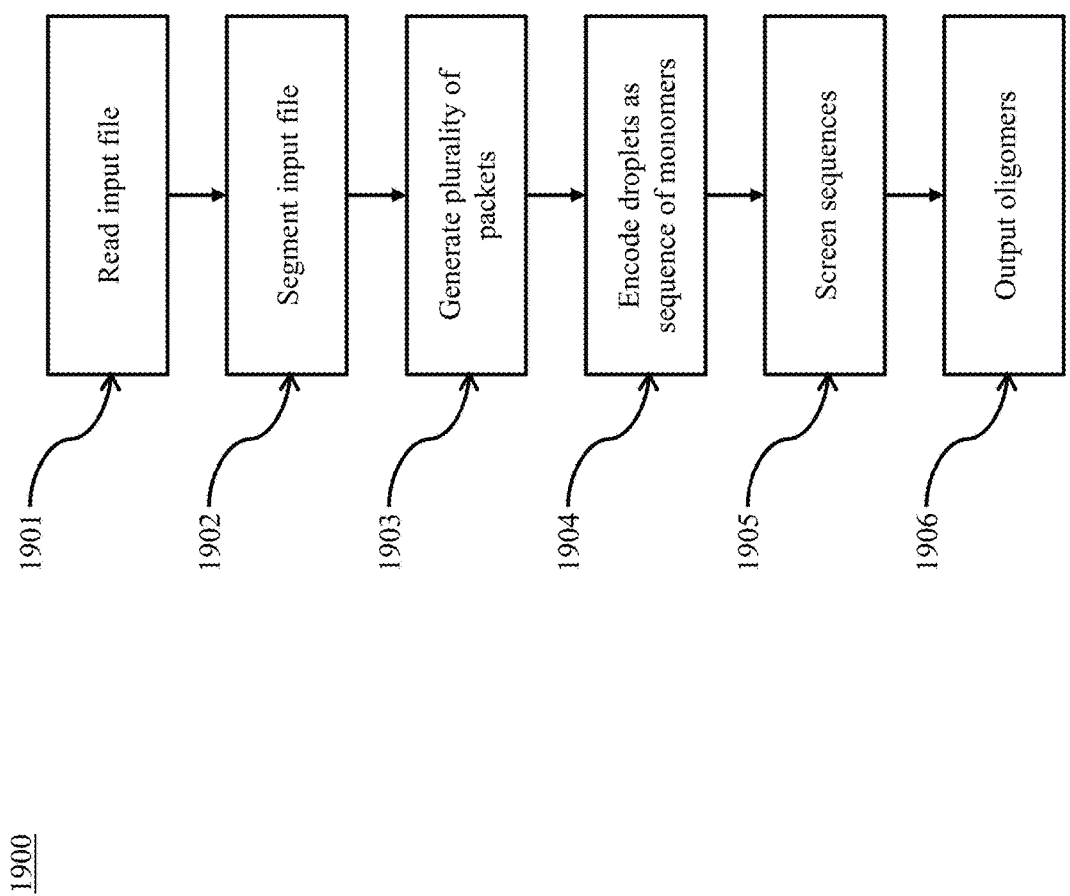
FIG. 19 illustrates a method for data encoding according to embodiments of the present disclosure.

Referring now to FIG. 19, an method for data encoding is illustrated according to embodiments of the present disclosure. At 1901, an input file is read. At 1902, the input file is segmented into a plurality of segments. At 1903, a plurality of droplets is generated from the plurality of segments by applying a fountain code. At 1904, each of the plurality of droplets is encoded as a sequence of monomers. At 1905, the sequences of monomers are screened against at least one constraint. At 1906, an oligomer is outputted corresponding to each sequence that passes the screening.

Various embodiments herein are described in terms of DNA and nucleotides. However, it will be appreciated that the present disclosure is applicable to any polymer. Accordingly, any polymer or oligomer made up of a plurality monomers is suitable for use as described herein. Example include DNA, RNA, and proteins. Likewise, although the term oligomer is used herein, it will be appreciated that no limit is implied as to the number of monomers in an oligomer. In general, an oligomer or polymer having any number of constituent monomers is suitable for use as described herein. It will be appreciated that monomers may comprise a nucleoside. A nucleoside may in turn comprise a phosphoramidite or photolabile group. A nucleoside may be linked to an enzyme.

It will be appreciated that a variety of constrains may be imposed in screening steps as outlined above. As set out above, various chemical, physical, or mechanical constraints may be applied in various embodiments. For example, a constraint on maximum homopolymer run may be imposed. In some embodiments, a maximum run of 4 is used. In some embodiments, a maximum run of 3 is used. In some embodiments, a maximum run of less than 4 is used. In some embodiments, a constraint on maximum GC (guanine-cytosine) content is imposed. In some embodiments, a maximum GC content of about 60% is used. In some embodiments, a maximum GC content of about 55% is used. In some embodiments, a maximum GC content of about 45% is used. In some embodiments, a target GC content is used as a constraint. In some embodiments, the target constrain is met if GC content is within a given range of the target, e.g., ±0.5%.

In some embodiments, a constraint on maximum open reading frame (ORF) length is imposed. An ORF is the part of a reading frame that has the ability to be translated. An ORF is a continuous stretch of codons that contain a start codon (usually ATG) and a stop codon (usually TAA, TAG or TGA). As set out above, a length constraint may be given in terms of nucleotides, or may be given in terms of amino acids. For example, in some embodiments, an ORF length constrain is imposed. In some embodiments, the maximum length is 10 amino acids. In some embodiments, the maximum length is less than 10 amino acids.

In some embodiments, a constraint on similarity to known sequence is imposed. For example, given a library of known sequences, nucleotide or amino acid similarity may be determined. A minimum or maximum similarity constraint may then be imposed. For example, a minimum similarity of 90% with respect to a known sequence may be required. In some embodiments, the library of known sequences may be drawn from a single organism. For example, the sequence for *Bacillus anthraces* may be used for screening.

Figure 20:
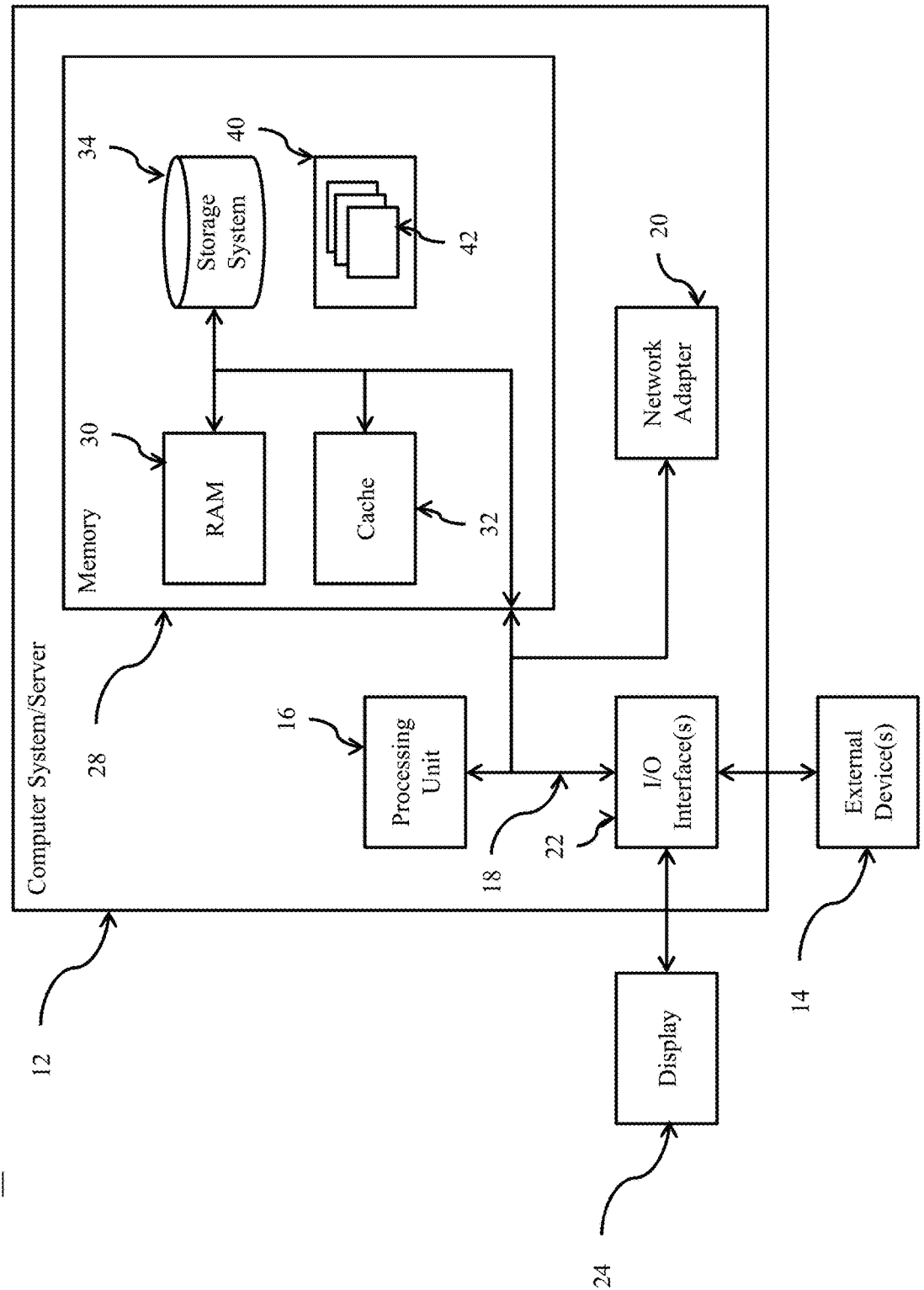
FIG. 20 depicts a computing node according to embodiments of the present invention.

Referring now to FIG. 20, a schematic of an example of a computing node is shown. Computing node 10 is only one example of a suitable computing node and is not intended to suggest any limitation as to the scope of use or functionality of embodiments of the invention described herein. Regardless, computing node 10 is capable of being implemented and/or performing any of the functionality set forth hereinabove.

In computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 20, computer system/server 12 in computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
reading an input file;
segmenting the input file into a plurality of segments;
generating a plurality of packets from the plurality of segments by applying a fountain code;
encoding each of the plurality of packets as a sequence of monomers;
screening the sequences of monomers against at least one constraint;
outputting an oligomer corresponding to each sequence that passes the screening, wherein the at least one constraint comprises a maximum homopolymer run and the maximum homopolymer run is less than or equal to 4 nucleotides.

2. A method comprising:
reading an input file;
segmenting the input file into a plurality of segments;
generating a plurality of packets from the plurality of segments by applying a fountain code;
encoding each of the plurality of packets as a sequence of monomers;
screening the sequences of monomers against at least one constraint;
outputting an oligomer corresponding to each sequence that passes the screening, wherein the at least one constraint comprises a maximum GC content, a target GC content, a maximum open reading frame length, or similarity to a known sequence.

3. The method of claim 2, wherein the maximum GC content is about 60%.

4. The method of claim 2, wherein the maximum open reading frame length is less than 10 amino acids.

5. The method of claim 2, wherein similarity is nucleotide similarity.

6. The method of claim 2, wherein similarity is amino acid similarity.

7. The method of claim 2, wherein the known sequence is a region of *Bacillus anthraces*.

8. A method comprising:
reading an input file;
segmenting the input file into a plurality of segments;
generating a plurality of packets from the plurality of segments by applying a fountain code;

encoding each of the plurality of packets as a sequence of monomers;

screening the sequences of monomers against at least one constraint; and outputting an oligomer corresponding to each sequence that passes the screening, wherein each monomer is a nucleotide, at least one monomer comprises a nucleoside and the nucleoside comprises a phosphoramidite or a photolabile group.

9. A method comprising:

reading an input file;

segmenting the input file into a plurality of segments;

generating a plurality of packets from the plurality of segments by applying a fountain code;

encoding each of the plurality of packets as a sequence of monomers;

screening the sequences of monomers against at least one constraint; and outputting an oligomer corresponding to each sequence that passes the screening, wherein each monomer is a nucleotide, at least one monomer comprises a nucleoside and the nucleoside is linked to an enzyme.

10. A method comprising:

determining a plurality of oligomers by sequencing a sample, each of the plurality of oligomers comprising a sequence of monomers;

determining a plurality of packets from the plurality of oligomers by mapping monomers to values, wherein determining the plurality of packets comprises decoding the plurality of oligomers in order of decreasing frequency;

recovering a plurality of file segments from the plurality of packets by applying a fountain decode;

assembling a file from the plurality of file segments.

11. The method of claim 10, wherein recovering the plurality of file segments comprises:

reading an error correction code from each of the plurality of packets.

12. The method of claim 10, wherein determining the plurality of oligomers comprises applying a k-mer correction strategy.

13. The method of claim 10, wherein determining the plurality of oligomers comprises applying at least one biochemical constraint.

14. A method comprising:

determining a plurality of oligomers by sequencing a sample, each of the plurality of oligomers comprising a sequence of monomers;

determining a plurality of packets from the plurality of oligomers by mapping monomers to values, wherein determining the plurality of packets comprises decoding the plurality of oligomers in order of decreasing frequency;

recovering a plurality of file segments from the plurality of packets by applying a fountain decode, wherein recovering the plurality of file segments comprises reading an error correction code from each of the plurality of packets;

assembling a file from the plurality of file segments.

15. A method comprising:

determining a plurality of oligomers by sequencing a sample, each of the plurality of oligomers comprising a sequence of monomers, wherein determining the plurality of oligomers comprises applying a k-mer correction strategy;

determining a plurality of packets from the plurality of oligomers by mapping monomers to values, wherein determining the plurality of packets comprises decoding the plurality of oligomers in order of decreasing frequency;

recovering a plurality of file segments from the plurality of packets by applying a fountain decode;

assembling a file from the plurality of file segments.

* * * * *